United States Patent
Baidya et al.

(10) Patent No.: US 10,885,259 B2
(45) Date of Patent: Jan. 5, 2021

(54) RANDOM FOREST MODEL FOR PREDICTION OF CHIP LAYOUT ATTRIBUTES

(71) Applicant: Intel Corporation, Santa Clara, CA (US)

(72) Inventors: Bikram Baidya, Portland, OR (US); John A. Swanson, Forest Grove, OR (US); Kumara Sastry, Hillsboro, OR (US); Prasad N. Atkar, Portland, OR (US); Vivek K. Singh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/557,945

(22) Filed: Aug. 30, 2019

(65) Prior Publication Data

US 2020/0004921 A1  Jan. 2, 2020

(51) Int. Cl.

| | |
|---|---|
| *G06F 30/00* | (2020.01) |
| *G06F 30/398* | (2020.01) |
| *G06F 17/18* | (2006.01) |
| *G06N 5/02* | (2006.01) |
| *G06K 9/62* | (2006.01) |
| *G06F 30/392* | (2020.01) |
| *G06N 20/00* | (2019.01) |

(52) U.S. Cl.
CPC ............ *G06F 30/398* (2020.01); *G06F 17/18* (2013.01); *G06F 30/392* (2020.01); *G06K 9/6232* (2013.01); *G06N 5/022* (2013.01); *G06N 20/00* (2019.01)

(58) Field of Classification Search
CPC ..... G06F 30/398; G06F 30/392; G06N 5/022; G06N 3/0418; G06N 20/00; G06K 9/6232; G06K 9/6282
See application file for complete search history.

(56) References Cited

U.S. PATENT DOCUMENTS

| | | | | |
|---|---|---|---|---|
| 10,303,823 | B2* | 5/2019 | Huang | ................ H01L 25/0657 |
| 10,409,165 | B2* | 9/2019 | Liu | ..................... G03F 7/70441 |
| 10,430,719 | B2* | 10/2019 | David | ................. G03F 7/70625 |
| 2007/0006113 | A1 | 1/2007 | Hu et al. | |
| 2007/0077500 | A1 | 4/2007 | Baidya et al. | |
| 2009/0148779 | A1 | 6/2009 | Baidya et al. | |
| 2011/0318672 | A1 | 12/2011 | Ogadhoh et al. | |
| 2013/0149638 | A1 | 6/2013 | Ogadhoh et al. | |
| 2015/0095859 | A1 | 4/2015 | Baidya et al. | |

(Continued)

*Primary Examiner* — Naum Levin
(74) *Attorney, Agent, or Firm* — Alliance IP, LLC

(57) ABSTRACT

An improved random forest model is provided, which has been trained based on silicon data generated from tests of previously fabricated chips. An input is provided to the random forest model, the input including a feature set of a pattern within a particular chip layout, the feature set identifying geometric attributes of polygonal elements within the pattern. A result is generated by the random forest model based on the input, where the result identifies a predicted attribute of the pattern based on the silicon data, and the result is generated based at least in part on determining, within the random forest model, that geometric attributes of the pattern were included in the previously fabricated chips, where the previously fabricated chips have chip layouts are different from the particular chip layout.

20 Claims, 15 Drawing Sheets

(56) References Cited

U.S. PATENT DOCUMENTS

| | | | |
|---|---|---|---|
| 2017/0109646 A1* | 4/2017 | David | G03F 7/70633 |
| 2018/0285493 A1* | 10/2018 | Huang | H01L 25/50 |
| 2019/0147127 A1* | 5/2019 | Su | G03F 7/705 |
| | | | 703/7 |
| 2019/0213446 A1* | 7/2019 | Tsou | H04W 12/10 |
| 2019/0277913 A1* | 9/2019 | Honda | G01R 31/2894 |
| 2019/0325321 A1* | 10/2019 | Swanson | G06K 9/6267 |
| 2020/0026196 A1* | 1/2020 | Luo | G03F 7/705 |
| 2020/0050099 A1* | 2/2020 | Su | G06N 20/10 |

\* cited by examiner

RANDOM FOREST MODEL FOR PREDICTION OF CHIP LAYOUT ATTRIBUTES

TECHNICAL FIELD

This disclosure relates in general to the field of computer systems and, more particularly, to search engines for use in integrated circuit development and testing.

BACKGROUND

In the field of integrated circuit (IC) manufacturing, a process known as photolithography (or simply "lithography") is typically employed in order to form circuitry features onto a substrate, such as a silicon wafer. In the process, an exposure operation is performed whereby selective portions of a photoresist film that is disposed on the wafer surface is exposed to electromagnetic radiation. The type of electromagnetic radiation used will depend upon the sizes of the circuitry features being formed. Typically, the smaller the size of the circuitry features being formed, the shorter the wavelengths of the electromagnetic radiation will be.

A goal in lithography is to maintain uniformity of each instance of an identical structure imaged or "printed" onto the substrate. In some cases, there may be systemic defects in certain structures that arise from a variety of causes such as imperfections in components of the lithography tool, mask defects, among other issues. As lithography techniques may be used not only to write patterns to fabricate semiconductor devices, but also to fabricate masks used therein, such systematic defects may arise in both cases, among other issues.

BRIEF DESCRIPTION OF THE DRAWINGS

Like reference numbers and designations in the various drawings indicate like elements.

DETAILED DESCRIPTION OF EXAMPLE EMBODIMENTS

Semiconductor manufacturing has become increasingly complex over the years. Since the turn of the century, the minimum feature size has shrunk by over an order of magnitude as the industry has progressed from the 130 nm to 10 nm technology nodes. At the same time, processor complexity has also increased. Current flagship semiconductor products have transistor counts that well exceed 10 billion. To handle these reduced feature sizes and increased chip complexities, companies must invest billions of dollars and years of research of developments efforts to build state-of-the-art fabrication facilities. The industry has done what it can to decrease manufacturing costs by, for example, moving from 200 mm to 300 mm wafers at the 90 nm technology node, but the overall trend has been companies have to be willing to pay an increasing price if they want to transition to the next generation of semiconductor manufacturing technology. With up to hundreds of individual dies on a wafer that now spans 12 inches wide, the total number of transistors that can be printed on a wafer is on the scale of one trillion. Developing a high-volume manufacturing process that can reliably manufacture transistors at such an extreme scale presents considerable challenges.

Figure 1A:
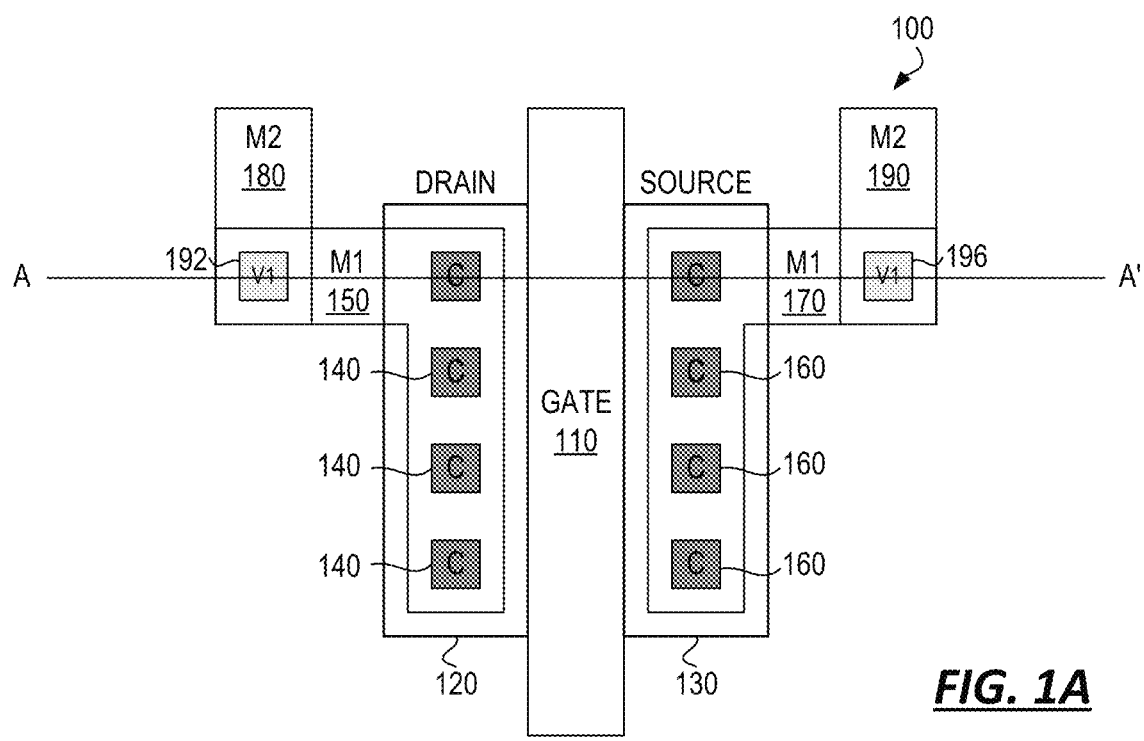
FIG. 1A illustrates the physical design of an exemplary planar transistor.

Turning now to FIGS. 1-3, an overview of various aspects of semiconductor device manufacturing is presented. FIG. 1A illustrates the physical design of an exemplary planar transistor. As well be discussed in greater detail below, the physical design of a product is used to generate masks that will be used during manufacturing to print the features on a wafer needed to implement the product. The physical design is typically a series of polygons drawn at various layers (e.g., gate layer, contact layer, metal-1 layer).

Transistor 100 is a field-effect-transistor (FET), the transistor type used in most modern semiconductor devices. Transistor 100 comprises gate 110, drain 120, and source 130 regions. The gate region in a field-effect transistor can be thought of as an "on-off" switch that controls the flow of current between the drain and source. When gate 110 is "off", there is no (or little) current flowing through the channel region connecting drain 120 to source 130, and when gate 110 is "on", current readily flows through the channel region. Transistor 100 is connected to other transistors by a series of interconnect layers that are stacked vertically on top of transistor 100. Contacts 140 connect drain 120 to segment 150 of a first metal layer (M1), and contacts 160 connect source 130 to M1 segment 170. M1 segments 150 and 170 are in turn connected to second layer metal (M2) segments 180 and 190 by a first level of "vias" (V1) 192 and 196, respectively. In general, metal layer thickness increases as one moves up the interconnect stack, with the thinner, lower-level metals being generally used for local routing of signals, and the thicker, upper-level metals being used for global signal routing and power/ground planes. For simplicity, FIG. 1A only shows two levels of metal. Current semiconductor manufacturing processes can have up ten layers of interconnect.

Figure 1B:
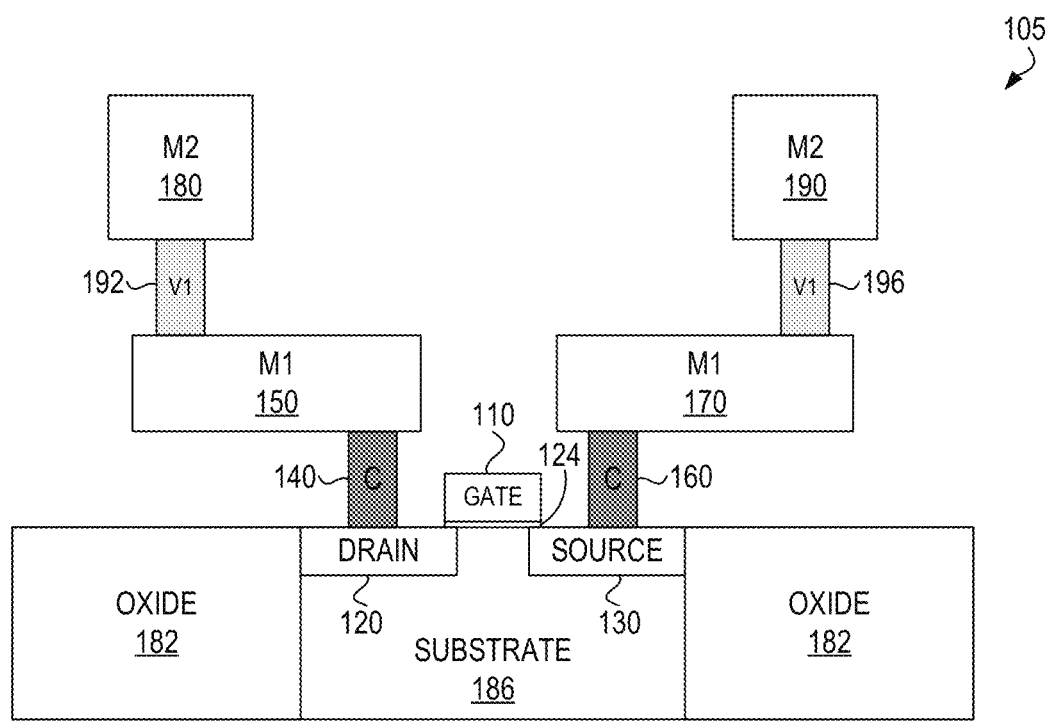
FIG. 1B illustrates an exemplary cross-section of the planar transistor of FIG. 1A taken along the line A-A'.

FIG. 1B illustrates an exemplary cross-section of the planar transistor of FIG. 1A taken along the line A-A'. Cross-section 105 shows gate 110 separated from drain 120 and source 130 regions by high-k dielectric layer 124, which electrically insulates gate 110 from drain 120 and source 130 regions. Transistor 100 is in substrate region 186 and is insulated from adjacent transistors by oxide regions 182. The planar transistor illustrated in FIGS. 1A and 1B is just one type of transistor topography, the planar nature of the transistor reflecting that the gate, source, and drain regions are located on or are adjacent to a relatively planar surface. Another type of transistor topography is the non-planar transistor topography used in FinFETS, which are used almost exclusively in cutting-edge manufacturing processes. FinFETS are field-effect transistors that operate under the same general principle as planar FET transistors—a gate controls the flow of current between drain and source regions—with the modification that the gate wraps around a series of "fins" that extend vertically upwards from the wafer surface.

Starting with a "blank" silicon wafer, hundreds of processing steps are performed to build the transistors and interconnects needed to create a finished device. Essential to semiconductor manufacturing is the process of photolithography, by which patterns are transferred from a mask onto a wafer. As previously mentioned, masks are used to define the shape and location of the various features for a processing layer. For example, a first mask can define oxide regions, a second mask can define high-k dielectric regions, a third mask can define source and drain regions, and a fourth mask can define where contacts will be placed. Additional masks are used to define each metal layer and the intervening via layers.

Figure 2A:
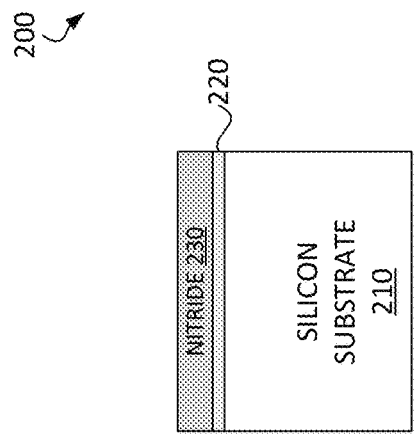
FIGS. 2A-2F illustrate an exemplary photolithography process.
Figure 2B:
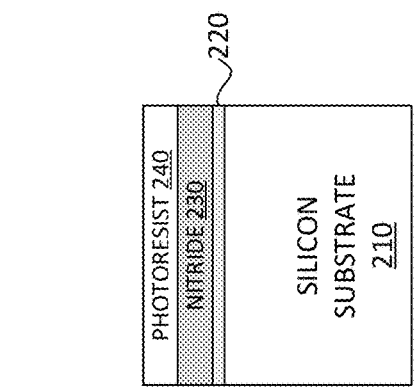
Figure 2C:
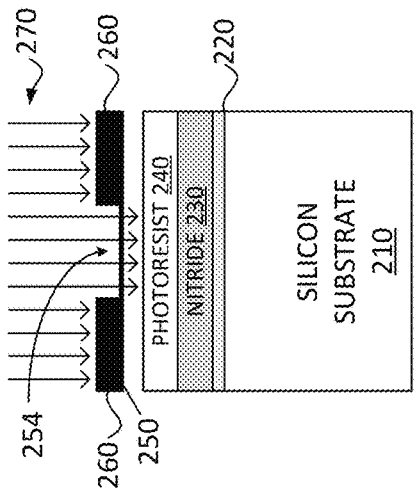
Figure 2D:
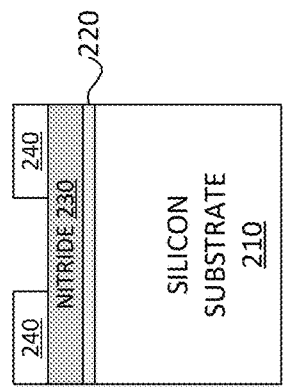
Figure 2E:
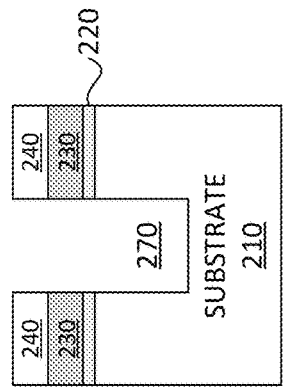
Figure 2F:
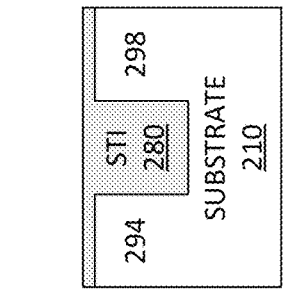

FIGS. 2A-2F illustrate an exemplary photolithography process. Process 200 illustrates how oxide regions 182 in FIG. 1B can be created using photolithography. In FIG. 2A, a thin silicon dioxide layer 220 is thermally grown across the top of silicon substrate 210. Silicon nitride layer 230, a protective layer, is deposited on top of silicon dioxide layer 220. In FIG. 2B, photoresist 240 is deposited on the wafer. A photoresist is a material whose reactance to an etchant or solvent increases (if a positive photoresist) or decreases (negative photoresist) upon exposure to light. In process 200, photoresist 240 is a positive photoresist. In FIG. 2C, mask 250 with patterns 260 drawn on it is oriented above the substrate 210 and exposed to light 270. The light 270 passes through transparent region 254 of the mask (where no patterns have been drawn) and exposes photoresist 240. Mask regions 260 where patterns have been drawn are opaque to light 270 and the photoresist regions under patterns 260 are not exposed to light 270. In FIG. 2D, photoresist 240 is chemically developed and the regions exposed to light 270 are dissolved. The remaining portions of photoresist 240 can now act as an on-wafer mask to allow for the selective processing of nitride layer 230. In FIG. 2E, the wafer is subjected to an etch step that removes the silicon nitride 230, silicon dioxide layer 230, and a portion of the substrate 210 to create trench 270. In FIG. 2F, the photoresist and nitride layers are removed, and trench 270 is filled with silicon dioxide to create shallow trench isolation (STI) region 280 that serves to keep transistors built in regions 294 and 298 electrically isolated from each other. In a similar manner, metal layer masks where metal will be deposited, gate masks define where high-k dielectric layers will be formed, etc.

As masks are the means by which features and patterns are realized on a wafer, any semiconductor device design must ultimately be reduced to a physical design from which masks can be generated. The physical design of a transistor (such as FIG. 1A), circuit, or processor to be manufactured is often referred to as a "layout." Electronic design automation (EDA) tools allow microprocessor architects and circuit designers to design at levels of abstraction above the physical design level, sparing them from having to spend their days drawing polygons in physical design CAD tools to realize their designs. Architects typically define their designs in a hardware design language (HDL), such as VHDL or Verilog. Once their designs have been verified to perform as desired, physical design can be generated automatically using a library of standard layout cells. Circuit designers often seek performance or functionality not available using standard cells, and typically enter their designs into a schematic capture tool. Once their custom designs are finalized, the circuit schematics are handed off to layout designers who manually craft the custom circuit layouts.

Regardless of whether a physical design is generated automatically or manually, it must conform to a set layout design rules that has been established for the relevant manufacturing process. Design rules are constraints that the physical design must obey in order to ensure that a product that can be manufactured with a high degree of repeatability. Most design rules express a minimum feature width or space, for example: gate width must be greater than or equal to 10 nm, source/drain diffusion enclosure of a contact must be at least 16 nm, the width of a first metal layer trace must be at least 20 nm, the space between metal-1 traces must be at least 20 nm, etc. Design rules represent a trade-off between feature density and manufacturability. Being able to print smaller feature sizes can mean more dies can be packed onto a wafer, which can reduce product cost, but if the process cannot reliably print the smaller features, the resulting reduction in wafer yield can more than offset the cost reduction gained by being able to print more dies on a wafer.

Developing design rules for a new process can be difficult as unexpected difficulties can arise. For example, a feature may not scale as much as expected from the previous technology generation due to unforeseen difficulties with a new processing step, a new tool, or other reasons. As process engineers develop a new manufacturing process, they continually fine-tune the individual processing steps to remove as many defect sources as possible. At some point, the process has been tuned enough that the remaining defects that need to be rooted occur so infrequently that they are difficult to find. Process engineers need to find the occurrence of the rare event during process development so that they can determine whether a tweak to the process can be figured out to reduce the occurrence of the rare event, or to add a design rule to the design rule set so that physical design arrangements that correlate to the rare event are kept out of the final physical design.

Once a physical design is clear of design rule violations, it is passed to the mask generation phase of the EDA tool flow. The mask generation phase is far from trivial due to the facts that the minimum feature size that can be printed clearly in a photolithographic process is limited by the wavelength of the light source used, and the large discrepancy between the wavelength of the light ($\lambda$=193 nm) that has been used since the 90 nm technology node and the minimum feature sized demanded by the current technology node (10 nm). In response to this challenge, the semiconductor industry has developed resolution enhancement technologies (RET) to allow for the printing of features well below the light source wavelength. A first set of RET techniques works to increase resolution or depth of focus, and a second set compensates for distortion effect due to printing features with a wavelength larger than the minimum feature desired as well as distortions inherent in deposition, etching, and other process steps. The first set includes techniques such as phase-shift masks and double-patterning, and the second set includes optical proximity correction (OPC).

Figure 3A:
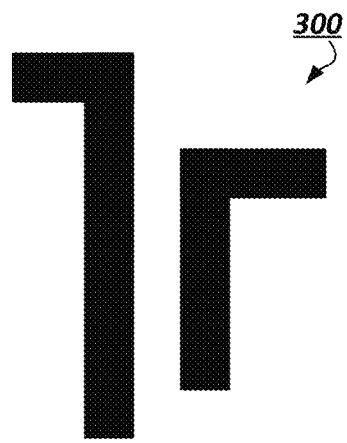
FIGS. 3A-3D illustrate the differences between as-drawn physical design features and as-printed wafer features due to process distortion effects and the use of optical proximity correction to counter those effects.
Figure 3B:
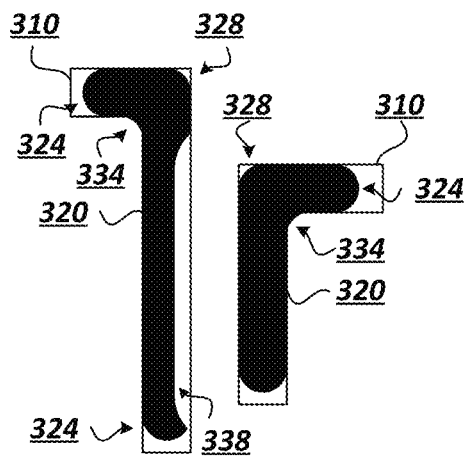
Figure 3C:
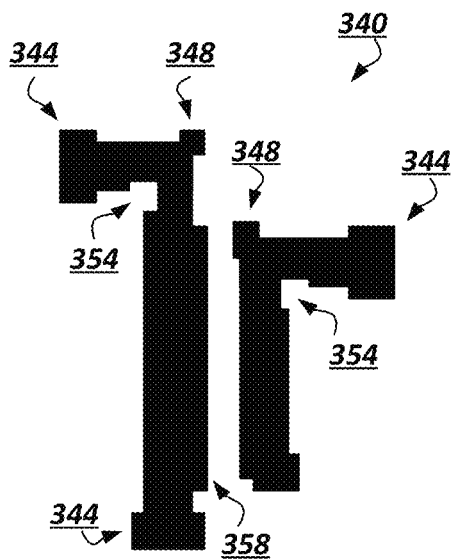
Figure 3D:
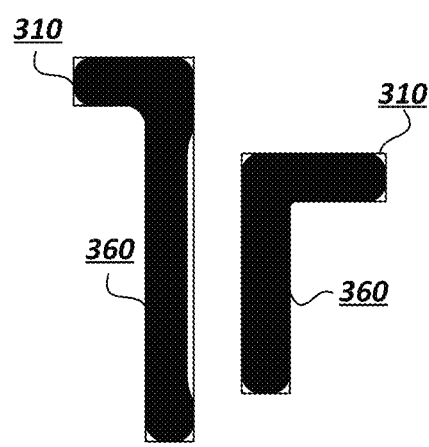

FIGS. 3A-3D illustrate the differences between as-drawn physical design features and as-printed wafer features due to process distortion effects and the use of optical proximity correction to counter those effects. FIG. 3A illustrates two gate polygons 300 in a physical design before being subjected to the OPC process. FIG. 3B illustrates a simplified view of how polygons 300 may appear after being printed on a wafer. Outlines 310 represent the boundaries of original polygons 300 and shapes 320 represents the corresponding as-printed features. Process distortions results in the ends and exterior corners of shapes 320 being rounded off (324, 328), interior corners being filled in (334), and traces being narrowed due to nearby neighboring features (338). FIG. 3C illustrates exemplary modified polygons 340 generated by subjecting original polygons 300 to an OPC process to counter process distortions. Modified polygons 340 are more complicated than original polygons 300. Modified polygons 340 include "dog-bone" features 344 that compensate for end rounding, "ear" features 348 that compensate for corner rounding, "mouse-bite" features 354 that compensate for interior corner rounding, and thickening features 358 that compensate for nearby neighbors. FIG. 3D illustrates a simplified view of how modified shapes 340 may appear after being printed. Outlines 310 again represent the boundaries of original polygons 300. Modification of original polygons by the OPC process results in printed features 360 that are closer to original polygons 300 shapes and sizes. The ends and corners of shapes 360 are less rounded off, the interior corners are less filled in, and the impact of nearby neighbors is diminished.

While OPC generation (and other RET techniques) have allowed minimal feature size to scale with technology node as the wavelength of the photolithographic light source has remained constant, it does not come without its costs. OPC generation is computationally intensive. OPC models, also known as OPC "recipes", can be based on physical models of various processing steps (photolithography, diffusion, etch, deposition, etc.) and attempt to compensate for the distortion of individual mask features, or be rule-based models that generate OPC features based on the layout characteristics (e.g., width, length, and shape of individual features and their nearest-neighbors) without relying on physical models. The application of model based OPC recipes to a complete physical design may involve the application of physical models to over 10 billion shapes at the gate layer alone and to billions of other shapes on other layers. Further, the generation of rule-based OPC recipes, which can be less computationally expensive that model-based OPC recipes, can be an involved process. Generation of rule-based OPC recipes can be based on trial-and-error due to a lack of full understanding of the complex physics and chemistries at play in the development of cutting-edge processing technologies. This trial-and-error can comprise iteratively manufacturing features with many variations of candidate OPC recipes and seeing which recipes produce the best results.

Figure 4:
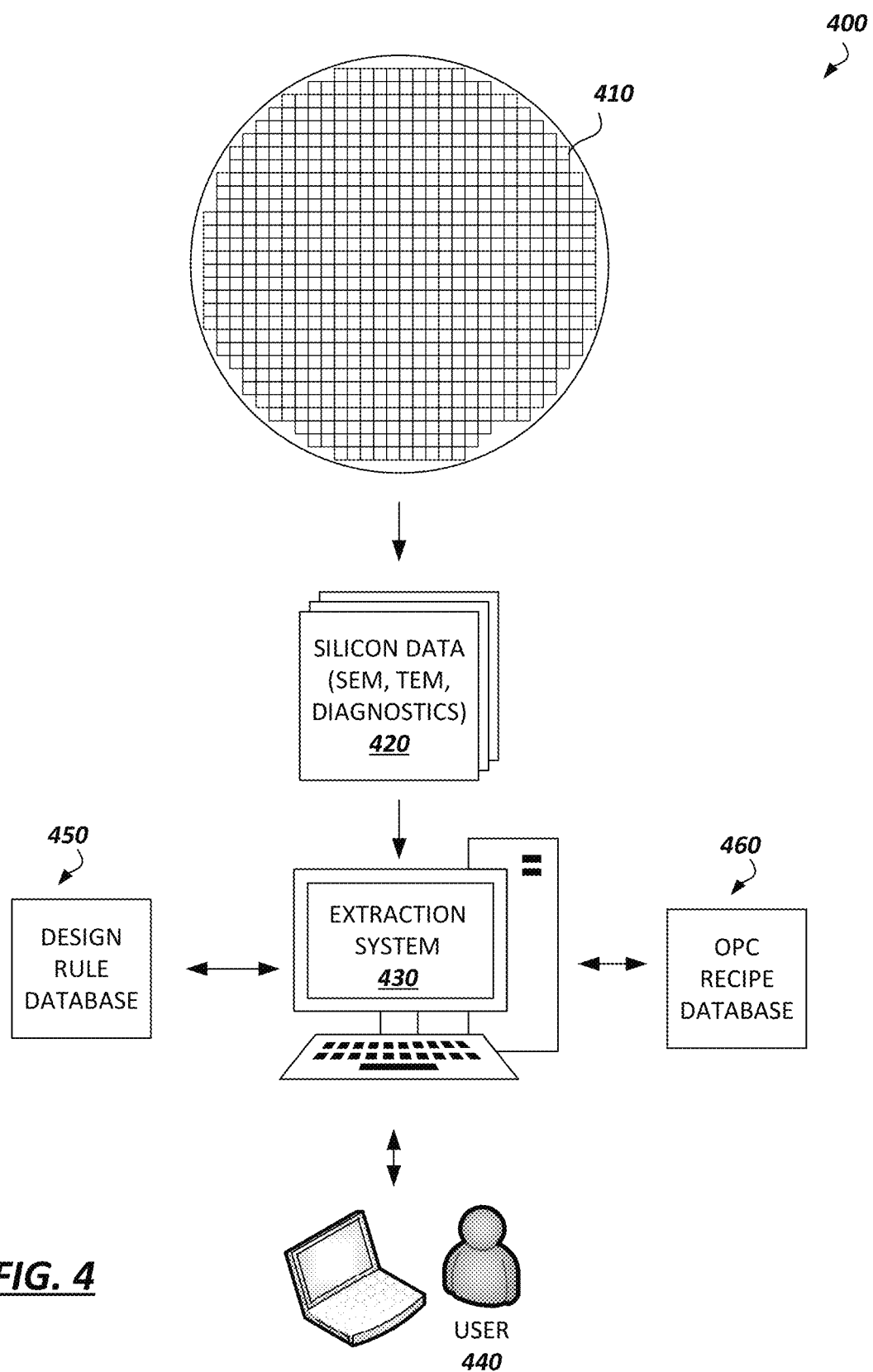
FIG. 4 illustrates an embodiment of how silicon data can be captured in a manufacturing process and provided to a system employing technologies described herein to aid process development and monitor process health.

FIG. 4 illustrates an embodiment of how silicon data can be captured in a manufacturing process and provided to a system employing technologies described herein to aid process development and monitor process health. Silicon wafer 400 comprises dies 410. As discussed earlier, current technology nodes employ 300 mm wafers, meaning a wafer can comprise hundreds of dies. Individual dies are separated by scribe lines that can contain test structures for process development or monitoring process health and that are consumed by the dicing process, whereby a wafer is cut into individual dies. During the manufacture of silicon wafer 400, silicon data 420 can be generated that can be used in the development of a new process or in monitoring the health of an existing one. Silicon data 420 can be any data collected during the manufacturing of wafer 400, including SEM images, TEM images, and diagnostic data. Diagnostic data can include data collected from the scribe line test structures, which can measure electrical properties of various features or layers (e.g., contact or via resistance, metal layer sheet resistance), or indicate the presence of manufacturing defects by testing for shorts between, for example, gate or metal structures having minimum feature sizes or other layout patterns of concern.

Any number of SEM images can be generated per wafer. SEM images can be taken of one or more portions of an individual die, for various die on the wafer. For example, an SEM image be taken of the gate layer in a region where the gate patterns are particularly dense (such as in a memory array), and for representative die distributed across the wafer to capture intra-wafer manufacturing processing variations. SEM images can be taken at any point in the manufacturing process. As SEM images can capture of field of view that is hundreds of microns in length and width, each image can contain many instances of critical features to be monitored.

Silicon data 420 can be generated for each wafer that is processed during process development or monitoring and can be generated for wafers processed across fabrication facilities in order to evaluate cross-facility manufacturing robustness. Given today's large wafer sizes, the complexities of modern processing technologies, and wafer run rates, the amount of silicon data that can produced can be tremendous. The number of SEM images generated during process development alone can reach into the millions.

As will be discussed in further detail below, silicon data 420 can be supplied to a semantic pattern extraction system 430 that digests the copious amounts of silicon data and presents to a process engineer or other user 440 information that may useful in process development or improvement. In some examples, the information provided can be semantic patterns (phrases or sentences that are easily understandable by a human) that suggest which physical design parameters or conditions may be responsible for causing a defect. In other examples, the system 430 can determine one or more design rules that could improve process yield and update design rule set 450 for the process or update an OPC recipe database 460 by updating an existing OPC recipe or creating a new OPC recipe that could result in improved yield.

As discussed above, modern chips may constitute billions of transistors and other circuit elements, based on their respective designs. Techniques have been developed to test chips both during design and manufacturing time, to determine the quality (e.g., yield) of the manufacturing process and/or chip design. Given the enormous number and complexity of structures in the chip, it is often prohibitively expensive to test the entirety of a wafer or even the entirety of a single chip or layer (reticle) of a single chip. Accordingly, in many instances, testing strategies focus on testing sections, or samples, of a chip, and inferring or assuming quality based on tests of these samples. These (and more involved, comprehensive) tests may be performed in order to identify "problem areas" affecting a particular chip design. For instance, certain portions, or sub-areas ("neighborhoods") of a chip layout may be identified as the source of various problems (e.g., affecting yield results, hardware errors, etc.). For instance, specific elements, or groups of elements, may be identified as the potential sources of issues affecting a particular chip design, the elements implementing utilizing semiconducting fabrication techniques, such as discussed above. Accordingly, in some implementations, chip elements, believed to be the source of an issue, may be implemented by defining particular geometries, polygons, shapes, etc. (also referred to herein as "features") to embody the element through the generation of corresponding masks to etch/deposit the elements according to these corresponding geometric patterns. Indeed, a pattern search (e.g., to identify a list of all locations in a large layout that match the given geometric configuration of a particular reference geometry) may play a critical role in many chip design and manufacturing application (e.g., predicting the impact of a yield-limiter pattern by identifying its number of occurrences in the design).

Various systems may be utilized to test silicon wafers and/or the component chips fabricated thereon to generate silicon data for the wafer and/or chip. For instance, testing may be performed during fabrication in connection with one or more of the steps of the fabrication process (e.g., masking, etching, polishing, etc.). Corresponding silicon data corresponding to each of these process steps may be generated from the tests. Further, functional testing may be performed, for instance, to test memory components produced on the chip (e.g., for defect density, addressing functionality, etc.), to test internal circuitry and logic of the chip (e.g., using Joint Test Action Group (JTAG) or other testing), among other functional testing. Structural testing may also be performed. Silicon data may be generated at various points in the manufacturing, packaging, distribution, and implementation of integrated chips. For instance, package-level testing may be performed by the supplier to demonstrate initial package integrity, board level testing may be performed to take into account issues identifiable at the circuit board level (e.g., handshaking, RC delays, etc.), system level testing may be performed to test whether the chip is able to successfully boot a corresponding operating system or other software, and field testing may be performed to test for defects or performance issues in actual (or emulated) end user configurations, among other examples. Testing and the resulting silicon data may be utilized to determine yield (e.g., at the wafer level) corresponding to a particular chip design and layout to be repeatedly printed on a wafer. For instance, yield may represent the proportion of "good" chips (e.g., chips determined to perform at a certain threshold of quality) to the overall number of the chips printed on the wafer.

In some implementations, testing (including yield testing) may identify particular features or patterns (e.g., groupings of geometric features in or comprising a neighborhood) that may be responsible for certain results identified in the silicon data. For instance, functional or structural defects may be determined to occur at higher frequencies in particular neighborhoods, where the presence of certain geometric features or patterns are found. While such information may be particularly helpful in improving yield and making adjustments in chips developed according to these known designs, as new chip designs are developed (at pre-manufacturing design time) corresponding silicon data is not available. Manufacturing test versions of a chip design solely to test the design's viability may be unrealistic and prohibitively expensive and nonetheless provide limited test results from which design improvements may be made, among other shortcomings.

Prediction of a new chip design's ultimate functional response and quality early in the development phase of the chip may be particularly value, allowing chip designers to make critical and yield-improving modifications to the chip before committing the design to silicon. In an improved system, predictive analysis of a chip design may be performed using machine learning models trained on historical silicon data. However, prediction based on historical silicon data may be difficult when the input data spans across multiple domains. For example, during the research and development phase of manufacturing for a new semiconductor device, it is critical to identify the yield limiting patterns and regions so that sufficient time can be allotted to rectify the process and/or design of any identified yield limiting layout pattern(s). The historical data for such yield limiters may span multiple domains that include SEM pictures, response of optical setup of lithography machines, physical resist response, and etch behavior, among other examples. Moreover, it is necessary to have a good predictability of the overall difficulty in achieving maximum yield for a given device. An improved machine learning system may be utilized to address at least some of these example challenges.

Figure 5:
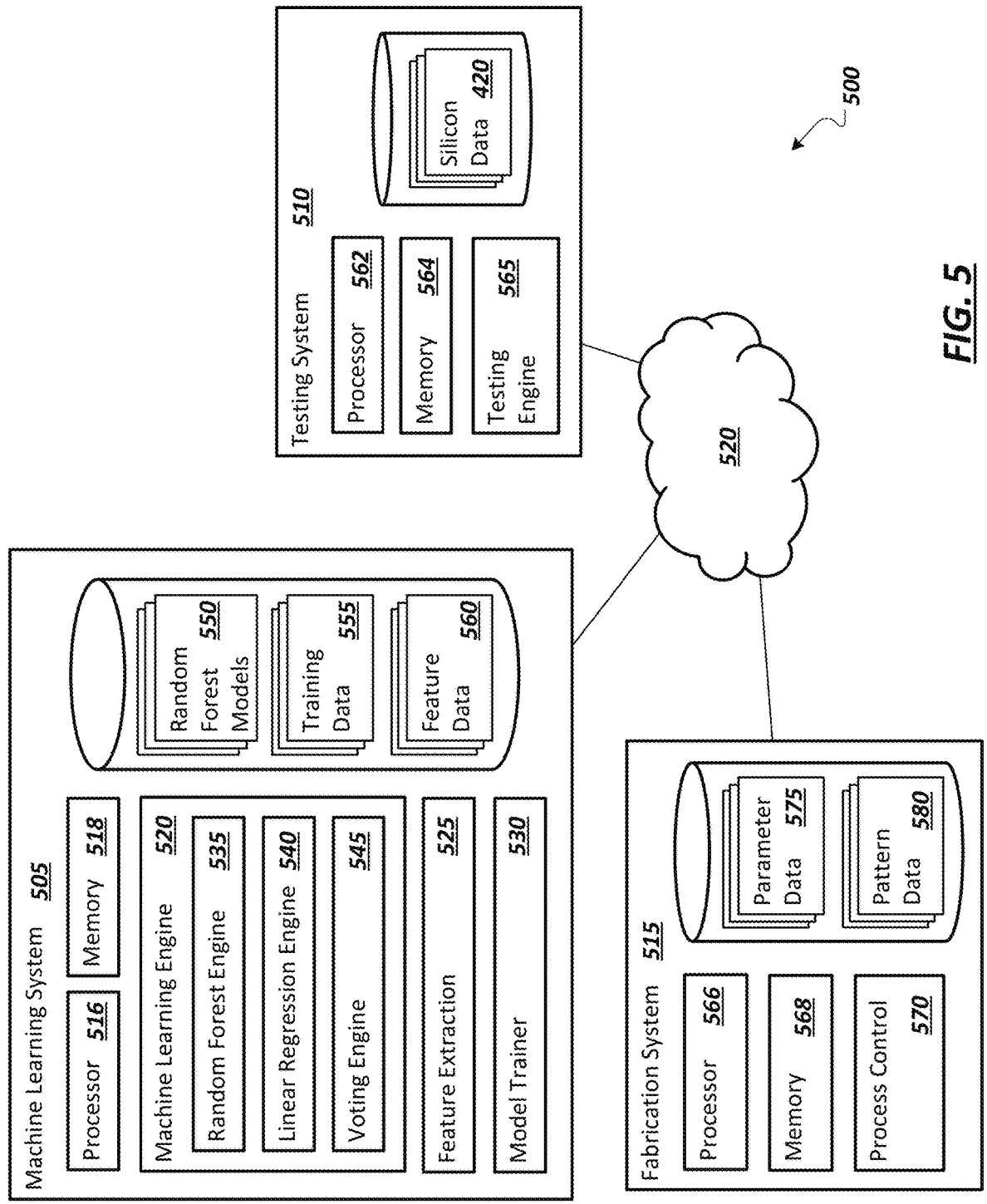
FIG. 5 is a block diagram of an example computing system implementing an improved machine learning model in accordance with some embodiments.

Turning to FIG. 5, a simplified block diagram 500 is shown illustrating an example system 505, which may enable improved analysis of chip layout data to predict yield limiting aspects of the design, as well as identify issues, which may arise at each of a series of manufacturing process steps based on a machine learning models trained from an array of historical silicon data (e.g., generated from testing, at multiple process steps and points in the lifecycles and applications of multiple different manufactured chip designs). For instance, an improved machine learning system 505 may utilize silicon data (e.g., 420) generated by one or more testing systems (e.g., 510) to train and develop supervised learning models (e.g., 550), which may be utilized to predict the performance of various new chip designs and serve as a basis for modifying and improving these chip designs. Metrics and results derived from the machine learning system 505 for a new chip design may be utilized, in some implementations, to tune and control fabrication systems (e.g., 515) that are to perform fabrication steps to manufacture chips based on the new chip design.

In one example, a machine learning system 505 may be implemented using one or more data processing devices (e.g., 516), one or more machine-readable memory elements (e.g., 518), among other components implemented in hardware and/or software to realize computer-implemented logic of the machine learning system 505. For instance, a machine learning engine 520 may be implemented to execute a set of supervised machine learning models (e.g., 550) based on historical silicon data (e.g., 420). For instance, the set of supervised machine learning models may include a set of random forest models 550. One or more respective random forest models 550 may be developed and trained for each of multiple different fabrication process steps to generate predictions for an input describing a portion of, or pattern within, a new chip layout design relevant to that processing step. The machine learning engine 520 may include logic to implement a random forest engine 535 to perform operations defined in a corresponding random forest model to implement and generate results from the random forest model. In some implementations, a random forest model may generate discrete prediction values. In other implementations, predictions may yield continuous (rather than discrete) values, by including linear regression sub-models within the random forest models 550, such as discussed herein. Accordingly, a linear regression engine 540 may also be provided to perform operations corresponding with linear regression sub-models included in some random forest models. A voting engine 545 may also be provided to apply a designated voting algorithm to the outputs of each of the decision trees in the ensemble random forest model (e.g., 550) to determine a result for the random forest model, among other example modules and logic.

In some implementations, inputs to random forest models 550 may be defined to include a particular set of features of a selected pattern within a new chip design layout. In some instances, the set of features may be extracted manually and fed as an input (e.g., a feature vector defined in feature data 560) to the corresponding random forest model. In other instances, a machine learning system (or sub-system) may include a feature extraction engine 525 to take, as an input, at least the portion of the chip layout data describing the subject pattern (e.g., pattern data 580) and parse the chip layout data (e.g., image data) to automatically determine the requisite set of features to be used as an input for a particular one (or each respective one) of the set of random forest models 550. In some implementations, a feature extraction engine may be programmed to identify a particular set of features predetermined based on an analysis of the historical result data. For instance, a particular subset of features may be detected as likely having relevance to the classifications, or results, to be predicted using a particular random forest model. Accordingly, a feature extraction engine (e.g., 525) may be programmed to detect, for the particular random forest model, the particular subset of features determined to be relevant to the subject of the particular random forest model. The same or separate feature extraction engines may be programmed to detect other subsets of features determined to be germane to other random forest models. In some implementations, machine learning algorithms may be utilized to automatically detect and extract these desired features from various source data (e.g., SEM image data, thermal heat map images, etc.), among other example implementations.

Random forest models 550 may be trained using training data 555 derived from silicon data 420 describing previously designed and fabricated chips. In some implementations, an example machine learning system 505 may include a model trainer 530. In other instances, a model trainer may be provided separate from the system hosting the machine learning engine (e.g., 520), among other alternative implementations. A model trainer 530 possesses computer-driven logic to train each of the set of random forest models 550 using corresponding training data 555. For instance, different training data may be generated for use in each of the set of random forest models 550 and may be based on various portions of the silicon data 420 available from historical chip designs. In some implementations, training data 555 may identify both geometric features of the chip designs from which silicon data 420 was generated, as well as identify attributes detected through testing of these historical chips (e.g., by testing systems (e.g., 510)) and described in the resulting silicon data 420. The trees within the random forest models 550 may be randomly generated an include nodes that determine whether an input includes certain geometric features or not. The training of the random forest models may be supervised by providing the attributes described in the silicon data pertaining to historical chips' performance and yield results as observed during testing of these historical chips. Accordingly, through training, geometric characteristics of historical chips, or of various neighborhoods or patterns present within these historical chips' layouts, may be determined, through training, to correlate with certain performance, process outcomes, or yield-related results. As such, a trained random forest model (e.g., 550) may then be used to test new, development-phase chip design patterns to identify potentially problematic patterns and predict yield outcomes and manufacturing process outcomes for the new chip design.

For instance, assessing the quality and predicting potential problems in a chip design is a complex multi-domain problem. The principles and solutions described herein may be extended or modified to apply to other multi-domain problems encountered in other state-of-the-art manufacturing processes. In cases of chip manufacturing, determining an accurate estimate of wafer or mask health traditionally required complex lithographic simulations to predict the average expected behavior of a particular pattern as well as the variations to this average behavior due to imperfect manufacturing conditions that include imperfect mask manufacturing, variable site-to-site nature of the photoresist, the dose variations, the stepper lens imperfections, the etch process variations, poor image contrast, and other factors. While the lithographic community in general has focused substantial research on predicting the average behavior of a given pattern to develop quality optical proximity correction (OPC) modeling and simulation procedures to predict patterns that are difficult to image. However, OPC modeling is but one aspect of the lithography process and numerous other factors may impact yield. For instance, accurate prediction on the variability component of a pattern has remain difficult due to lack of new-device specific data during early stages of process development.

In some implementations, the nodes of example random forest trees may be formed to identify prime geometric modulators that along with the process variations cause the largest impact on the resultant health of the wafer (upon which a chip design is to be etched). Using supervised learning algorithms that employ micro-level (e.g., data associated with each geometric pattern) historical silicon data from earlier device manufacturing, machine learning models are built. Given any pattern (even previously not seen) from a chip design as an input, these trained random forest models 550 can identify which patterns manufactured in the past (among many millions of choices) behave a relevant way and use this historical knowledge to predict how the geometry within these new patterns can affect the variability of resultant features.

For instance, for a new chip design pattern, a relevant feature set may be determined representing the defining characteristics of the patterns, such as the width and height of polygons within the pattern, the mirror-invariant neighboring distances of one or more reference polygons in the pattern to other neighboring polygons (e.g., to the nearest neighboring polygon in each of eight cardinal directions), the width and heights of all neighboring polygons detected to be within a given threshold distance from the reference polygon, density of geometry within the pattern neighborhood, the shape and angles employed in the polygon(s), the longest and shortest sides of the polygon(s), among other examples. These characteristics and metrics defining a given patterns characteristics may be embodied as a feature set, or feature vector, to be supplied as an input to the random forest model. Similarly, training data may be generated from historical silicon data 420 by identifying similar defining characteristics of micro-level patterns within the corresponding chips' respective layout designs. In some cases, the training data 555 may be thereby represent a large and diverse array of observed data points (which may differ over time, location, tool or specific process used).

As further shown in the example of FIG. 5, a machine learning system 505, in some embodiments, may interface with other systems, such as testing systems (e.g., 510) and fabrication systems (e.g., 515). In some implementations, one or more of such systems may be implemented on distinct physical computing systems, which may be interconnected by one or more wired or wireless networks (e.g., 520). In one example, a testing system 510 may be implemented using one or more data processing devices (e.g., 516), one or more machine-readable memory elements (e.g., 518), among other components implemented in hardware and/or software to realize computer-implemented logic of the testing system 510. A variety of different testing systems may be provided to test various aspects of a chip as it undergoes various processing steps performed by various fabrication tools. A testing system 510 may therefore include a testing engine 565 adapted to the testing of a wafer and/or chip(s) at or following a corresponding process step. Corresponding silicon data 420 may be generated from the testing. In some instances, an expansive collection of silicon data 420 may be generated for certain models or runs of chips (e.g., corresponding to the fabrication and testing of potentially millions of versions of the chip). Similarly, for manufacturers developing multiple different chips or generations of chips, a deep and diverse array of silicon data may be generated by that manufacturer for a similarly diverse collection of chip designs. Additionally, in some implementations, a repository of silicon data may be made available from multiple manufacturers, allowing an even more diversified collection of silicon data, among other examples.

Results returned by the machine learning system 505 representing predicted results or attributes from fabrication of a chip design, based on one or a collection of input patterns (e.g., representing micro-level subsections of the overall chip layout) may be generated, and in some cases, compiled to be used as inputs to other systems involved in the design, masking, and eventual manufacture of the chip design. For instance, an example fabrication system (e.g., 515) may include process control subsystems and tools (e.g., 570), which may be implemented using corresponding machine-executable code stored in memory (e.g., 568) and executed by one or more data processors (e.g., 566). A fabrication system 515 may utilize pattern data 580 defining a particular chip layout to control the performance of various lithography process steps. Pattern data 580 may represent corrected, modified, or optimized versions of an original chip layout, which was modified based on results derived from the original chip layout patterns being provided as inputs to one or more machine learning models (e.g., 550). Likewise, parameter data 575 may be utilized by a process control tool 570 to dictate the manner in which a particular process step should be carried out. Parameter data 575 may also be based on or derived from results of analyses performed for a corresponding chip design using machine learning models (e.g., 550), such as introduced herein. For instance, a random forest model generated to corresponding to a polish step may be utilized to determine, for a particular chip design, the duration or pressure to apply during a polish step with wafers including the particular chip design, among a myriad of other examples.

In some implementations, the systems discussed herein (e.g., 505, 510, 515) may be implemented as a computer device, such as a personal computing device, mobile computing device, server computing system (e.g., a rack scale, blade server, or other server computer), a computing system implemented on a tool or other manufacturing machine, among other examples. The system 205 may run an operating system such as Windows, Linux, iOS, Symbian OS, Unix, Android, among other examples. Through such an operating system (or virtual machines or software containers implemented on the system), the system may have the capability to run applications locally and/or communicate with applications that are provided by remote servers in a communications network. Such systems may be implemented in a variety of form factors and embodiments.

Example systems, as illustrated in FIG. 5, may further include one or multiple computer-accessible memory elements. For instance, memory elements may be implemented as non-transitory computer readable media, such as flash memory, a magnetic disk drive, an optical drive, a programmable read-only memory (PROM), a read-only memory (ROM), or any other physical memory device or combination of such memory elements. Logic implemented in software can run on a processor capable of executing computer instructions or computer code. The processor might also be implemented in hardware using an application specific integrated circuit (ASIC), programmable logic array (PLA), field programmable gate array (FPGA), or any other integrated circuit. In some embodiments, a system may include or be implemented as a system on chip (SOC). In other embodiments, one or more blocks in a parallel processing device can be implemented as a separate chip, and the parallel processing device can be packaged in a system in package (SIP). In some embodiments, at least some logic and functionality of a machine (e.g., machine learning system 505) may be implemented using one or more hardware accelerator device implementing specialized functionality for use in performing various operations used by the system (e.g., by machine learning engine 520), among other example implementations.

Figure 6:
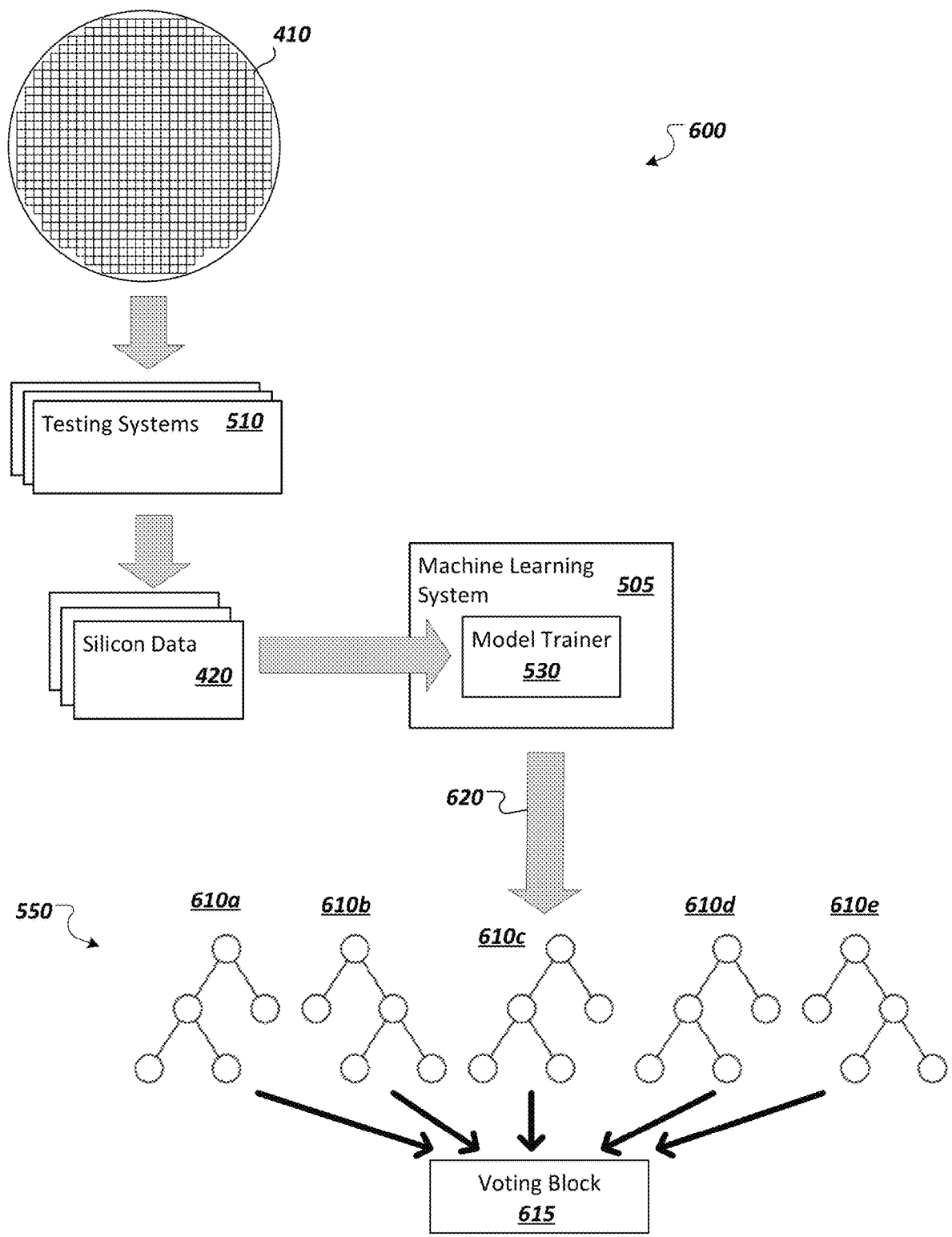
FIG. 6 is a block diagram illustrating an example development of a set of random forest machine learning models in accordance with some embodiments.

Turning to the simplified block diagram 600 of FIG. 6, an example flow is shown for building a set of improved machine learning models for use in performing predictive analytics of a proposed chip design layout. As illustrated, a collection of different chip designs may be designed and manufactured (e.g., on a wafer 410) and the wafer 410 may be tested for quality and defects (and overall yield) through a series of tests performed by one or a suite of testing systems (e.g., 510). Such tests may be carried out at various phases of the manufacturing process, as well as following manufacturing (e.g., as the individual chips are packaged, integrated in computing systems, deployed at customers, etc.). Various silicon data 420 may be generated through each of these tests. As multiple tests of multiple different chip designs may be performed, a rich collection of varied silicon data 420 may likewise be generated. Portions of this silicon data may be adapted for use as training data to be used by a model trainer engine 530 of an example machine learning system 505. For instance, various random-forestbased machine learning models (e.g., 550) may be developed to correspond to various stages or manufacturing processes of a chip. Silicon data generated to describe quality or attributes of a chip associated with stages and processes may be parsed to generate corresponding training data. Such training data may then be provided (e.g., at 620) as inputs to each of the individual tree models (e.g., 610a-e) embodying a random forest model 550. Training of the tree models may be supervised, with (at least a portion of the) nodes of the individual trees used to identify specific geometric features of a micro-pattern within a historical chip design, and the output of the tree indicating the observed characteristics for that historical chip design (e.g., as identified in silicon data generated from testing of the resulting historical chip). The set of diverse training data derived from the silicon data 420 may be used to train each of the individual trees 610a-e in the random forest to generate a trained version of the random forest model. Outputs of the decision trees 610a-e may be fed to a voting block 615 within the random forest model 550 implementing a particular voting algorithm defined for the respective random forest model 550 (e.g., weighted voting, adjusted weight voting, majority voting, regression voting, worst case voting (e.g., for random forests used to predict critical behavioral values), etc.). Different random forest models 550 used in the analysis of a chip design pattern may employ the same or different voting algorithm. In some cases, the selection and definition of the voting algorithm can also be based on corresponding silicon data and may be refined during training of the model 550 and/or may be based on the type of value to be output by the respective random forest model. Further, training of the random forest model 550 may be continuous, in that relevant, newly generated silicon data generated from testing of additional chips may be provided to the model trainer 530 on an ongoing basis to further refine and improve the random forest model 550, among other example features and implementations.

Figure 7:
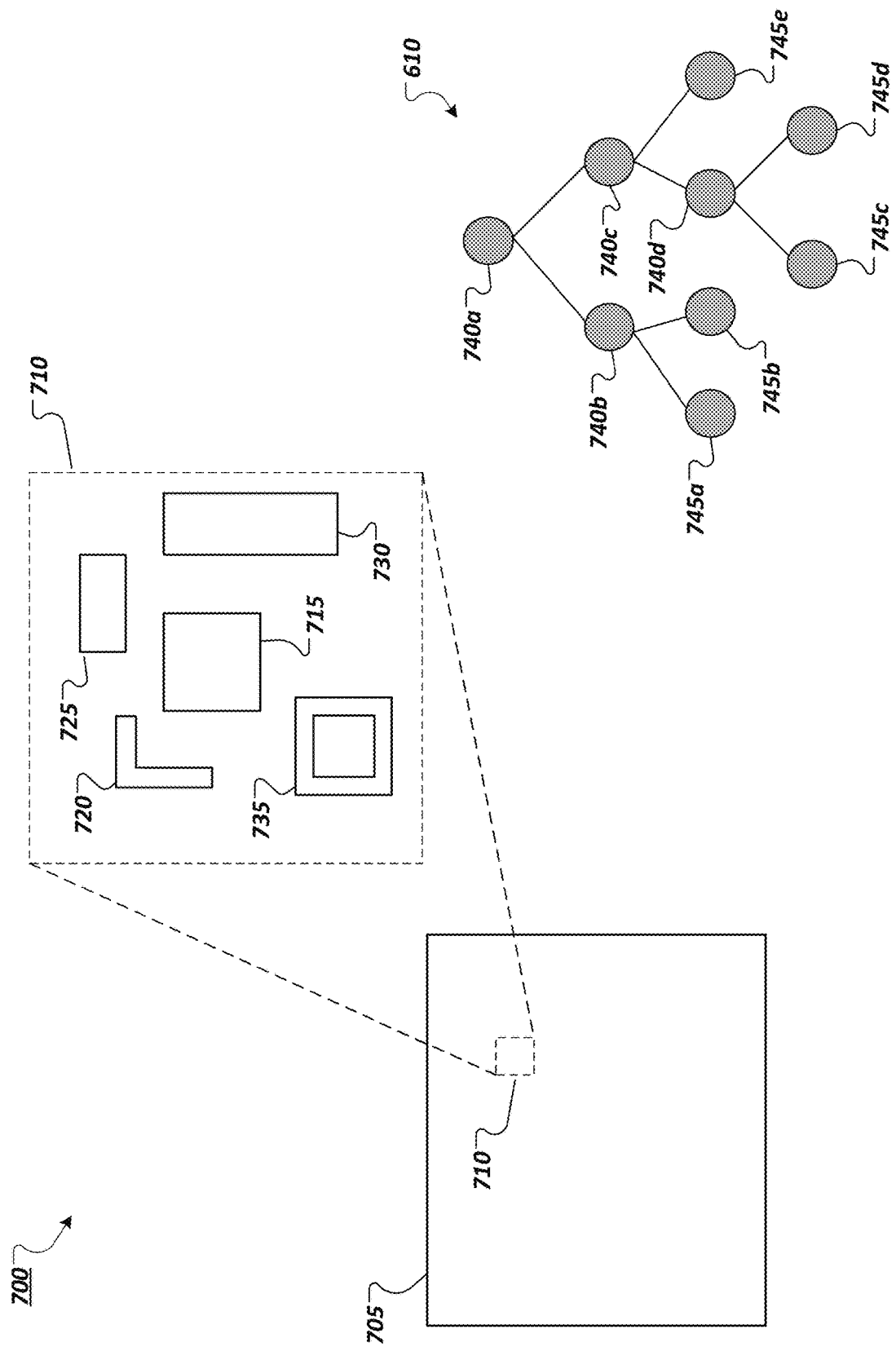
FIG. 7 is a simplified block diagram illustrating a relationship between chip pattern geometry and trees within an example random forest model in accordance with some embodiments.

FIG. 7 is a simplified block diagram 700 including a representation of a chip layout 705. A multitude of micro-level patterns (e.g., 710) may make up the area of the overall chip layout 705. A single pattern 710 may include one or multiple elements (e.g., 715, 720, 725, 730, 735) of varying geometries. The features determined for the pattern 710 may be based on the geometries of the collection of elements (e.g., 715, 720, 725, 730, 735) within the pattern. Such features may be determined automatically by parsing image data of the pattern (e.g., using a convolutional neural network-based tool or other computer vision technology). In some implementations, at least some features of a pattern (e.g., 710) may be based on a reference element (e.g., 715) determined for the pattern 710. For instance, a geometrically centermost polygon (e.g., 715) may be designated as the reference element for the pattern 710. "Neighbor" elements (e.g., 720, 725, 730, 735) may be defined relative to the reference element 715. For instance, a nearest neighbor of the reference element 715 may be identified in each of the axis or cardinal directions from the reference element 715 and the respective distances from the reference element 715 to each of these neighbor elements (e.g., 720, 725, 730, 735) may serve as features of the pattern 710, among other example features. For instance, feature of a pattern may include the sizes and shapes of each of the polygonal elements (e.g., 715, 720, 725, 730, 735) in the pattern, the density of the pattern (e.g., what proportion of the overall area of pattern is occupied by such elements), three-dimensional aspects of the elements, among other examples. Values may be defined to correspond to each of the observed features in the pattern and a corresponding feature vector may be defined.

In some cases, the size of the pattern may be based on the classifications to be performed using a corresponding random forest model. For instance, some attributes of a chip design in a particular manufacturing process may be at a micro-level (e.g., a nanometer level) such as deposition, etching, and masking processes, while other processes are at a longer-range level (e.g., polishing). Accordingly, classifications involving attributes at the micro-level may be determined using random forest models that are trained on and accept feature data describing a smaller-dimensioned pattern, while longer-range classifications are determined using random forest models that are trained on and accept feature data describing larger-dimensioned patterns, and so on.

FIG. 7 additionally shows an example simplified decision tree 610, representing an individual tree, which may be included within a random forest model. The tree 610 may include a collection of interconnected nodes (e.g., 740a-d, 745a-e). Test nodes (e.g., 740a-d) each represent a test on a particular (randomly-selected) attribute. Such attributes may be geometric, corresponding to geometric features in the feature vector input. For instance, a test node may test a given input pattern for the presence of a polygon (e.g., 715, 720, 725, 730, 735) with particular dimensions, shape, or other particular geometric characteristic. If the pattern (e.g., 710) includes the attribute, a corresponding branch is followed to a next node, until a leaf node (e.g., 745a-e) is reached. Each leaf node 745a-e may hold a class label to identify a result of the tree 610 (based on the outcomes of the preceding test nodes (e.g., 740a-d). Generally, on a trained decision tree (e.g., 610), certain classification results may be determined to correspond to various combinations of geometrical (and other) attributes, as determined based on the historical silicon data. As an input pattern is determined to include more of these geometrical attributes, the input pattern may be more likely classified as being associated with the attributes or outcomes associated with these classification results. For instance, a particular random forest model may be defined to predict performance of a chip pattern during a deposition step. During training, it may be determined that historical patterns with elements of a certain dimension and shape are more likely to result in defects during deposition, negatively impacting yield. Accordingly, when a new chip layout pattern is presented as an input, decision trees in the random forest may be expected to similarly classify the input pattern as having a greater likelihood of negative deposition results, among other examples.

Figure 8A:
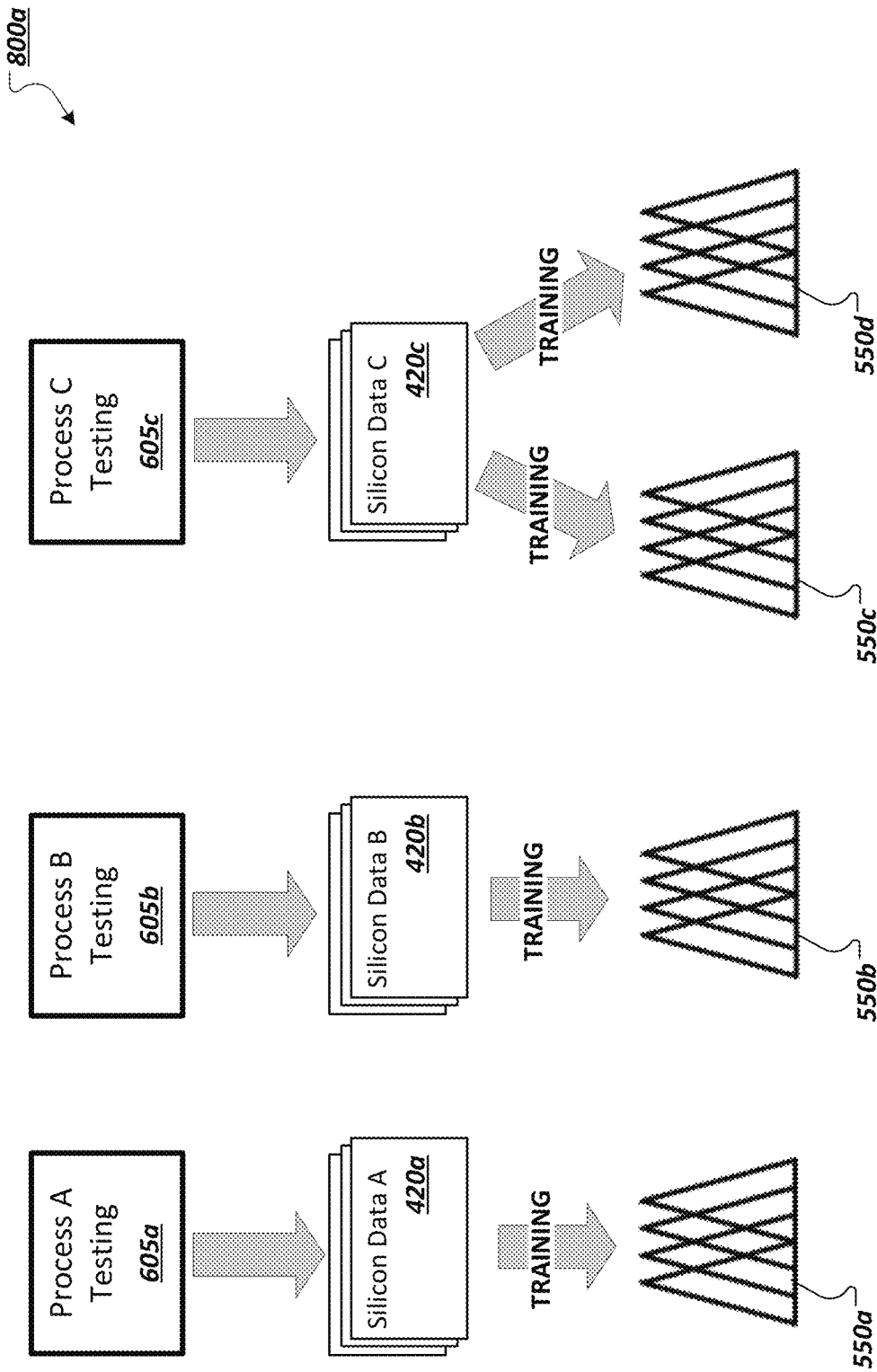
FIG. 8A is a simplified block diagram illustrating use of silicon data to train a set of random forest models in accordance with some embodiments.
Figure 8B:
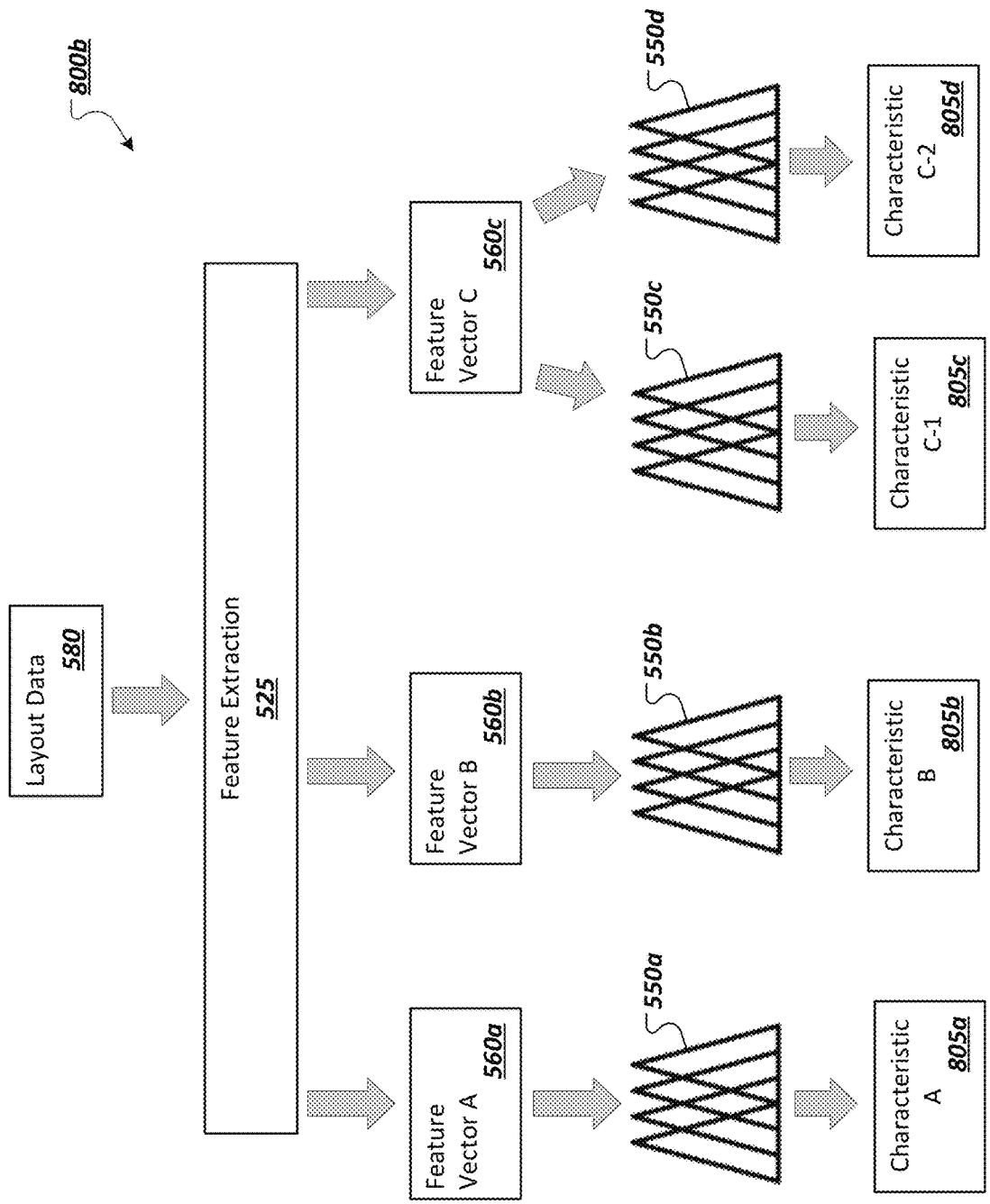
FIG. 8B is a simplified block diagram illustrating use of an example set of random forest models in accordance with some embodiments.

Turning to FIGS. 8A-8B, simplified block diagrams 800a-b is shown illustrating an example set of random forest models, which may be developed to generate a set of predictions for use in development and manufacturing of a sample chip layout. For instance, in FIG. 8A, the respective training of a set of random forest models (e.g., 550a-550d) is represented. As introduced above, various silicon data (e.g., 420a-c) may be generated from testing of historical chips in connection with various process steps (e.g., lithography processes such as masking, deposition, etching, polishing, etc.). For instance, tests (e.g., 605a-c) may be performed in connection with various process steps (e.g., Processes A, B, and C). Likewise, a collection of multiple different random forest models (e.g., 550a-d) may be developed, which are each used to predict attributes of particular process step(s) being performed on a wafer incorporating chips with design layouts that include one or more instances of a reference pattern (provided as an input to the random forest model). Indeed, multiple random forest models (e.g., 550*c* and 550*d*) to predict multiple different attributes or qualities that may be expected for a given chip design pattern as it relates to a corresponding process (e.g., Process C). Accordingly, training data derived for these random forest models (e.g., 550*a-d*) may be prepared or generated from the collection of historical data (e.g., 420*a-c*) describing historical chips' attributes associated with the corresponding process-related test (e.g., 605*a-c*). This training data may then be used to train the corresponding process-related random forest model(s) (e.g., 550*a-d*). As an example, silicon data 420*c*, generated from testing 605*c* corresponding to a fabrication process C may be the serve as the basis of historical training data to be used to train those random forest models (e.g., 550*c*, 550*d*), which predict attributes relating to process C (e.g., for new chip layout patterns), among other examples.

Turning to FIG. 8B, upon training the individual process-related random forest models 550*a-d* using training data derived from corresponding process-related sensor data, the models 550*a-d* may be used (e.g., executed by a machine learning engine) to determine corresponding process-related characteristics (e.g., 805*a-d*) for new chip layout designs. For instance, layout data 580 may be provided to the machine learning system as an input. Layout data 580, in some cases, may describe only a select pattern within the total layout of a chip reticle (e.g., covering a sub-area at the nanometer or micron level and including only a miniscule sampling of the potentially trillions of elements in the chip design). In some implementations, the layout data 580 may be a graphical representation of the chip layout portion. In other cases, the layout data 580 may describe features of the chip layout portion (e.g., as feature data, such as a feature vector). In some implementations (such as illustrated in FIG. 8B), a machine learning system may automatically parse image layout data and automatically determine relevant features of the portion of the layout image for inclusion in a feature vector input adapted for a respective one of the available machine learning models used to predict performance of lithography process steps involving the proposed layout portion. For instance, different feature vectors (e.g., 560*a*-560*c*) may be derived from the same layout data 580 using a feature extraction tool 525. For instance, machine learning model 550*a* may take, as an input, a first feature vector 560*a* including values for a first set of features. This set of features may pertain to a set of features considered or determined to be of importance in determining a corresponding characteristic (e.g., 805*a*). Additional feature vectors 560*b*, 560*c*) may be determined to correspond to other machine learning models (e.g., 550*b-d*). In some instances, the same feature vector (e.g., 560*c*), describing geometric features of a given layout pattern, may be provided to multiple different machine learning models (e.g., 550*c*, 550*d*), including two random forest models generated for two different lithography process steps, among other examples.

Continuing with the example of FIG. 8B, process-related random forest models (e.g., 550*a-d*) may each receive inputs (e.g., 560*a-c*) describing features of the same chip layout. Some inputs may be feature vectors describing a layout pattern for the chip incorporating a first sub-area of the layout while other inputs are feature vectors describing other layout patterns incorporating other (e.g., smaller or larger) sub-areas of the layout, among other examples (e.g., where the same pattern and same feature vector is used for multiple different random forest models relating to different respective process steps). The respective trained random forest models (e.g., 550*a-d*) may then return classification results for the inputs to identify a characteristic related to the corresponding process step. For instance, various types of characteristics (e.g., 805*a-d*) may be communicated through the respective results of different random forest models (e.g., 550*a-d*). As examples, a random forest model may be configured to return a result to indicate a predicted defect rate, a predicted yield limiting value, a parameter to be applied during the process to yield a successful outcome, a critical dimension for the polygons in the layout, a minimum permissible distance between neighboring polygons, a maximum density value, among other examples. Indeed, through a suite of different random forest models (e.g., 550*a-d*) a collection of valuable predictions may be generated for a proposed chip layout to provide designers with a more comprehensive view of how the layout may perform at each of the specific steps of the lithography process and what adjustments may be made to improve the predicted yield. Likewise, multiple different patterns of the same chip layout may be provided as inputs to the suite of random forest models to obtain a more complete view of how the overall layout is likely to fair during manufacturing.

Figure 9:
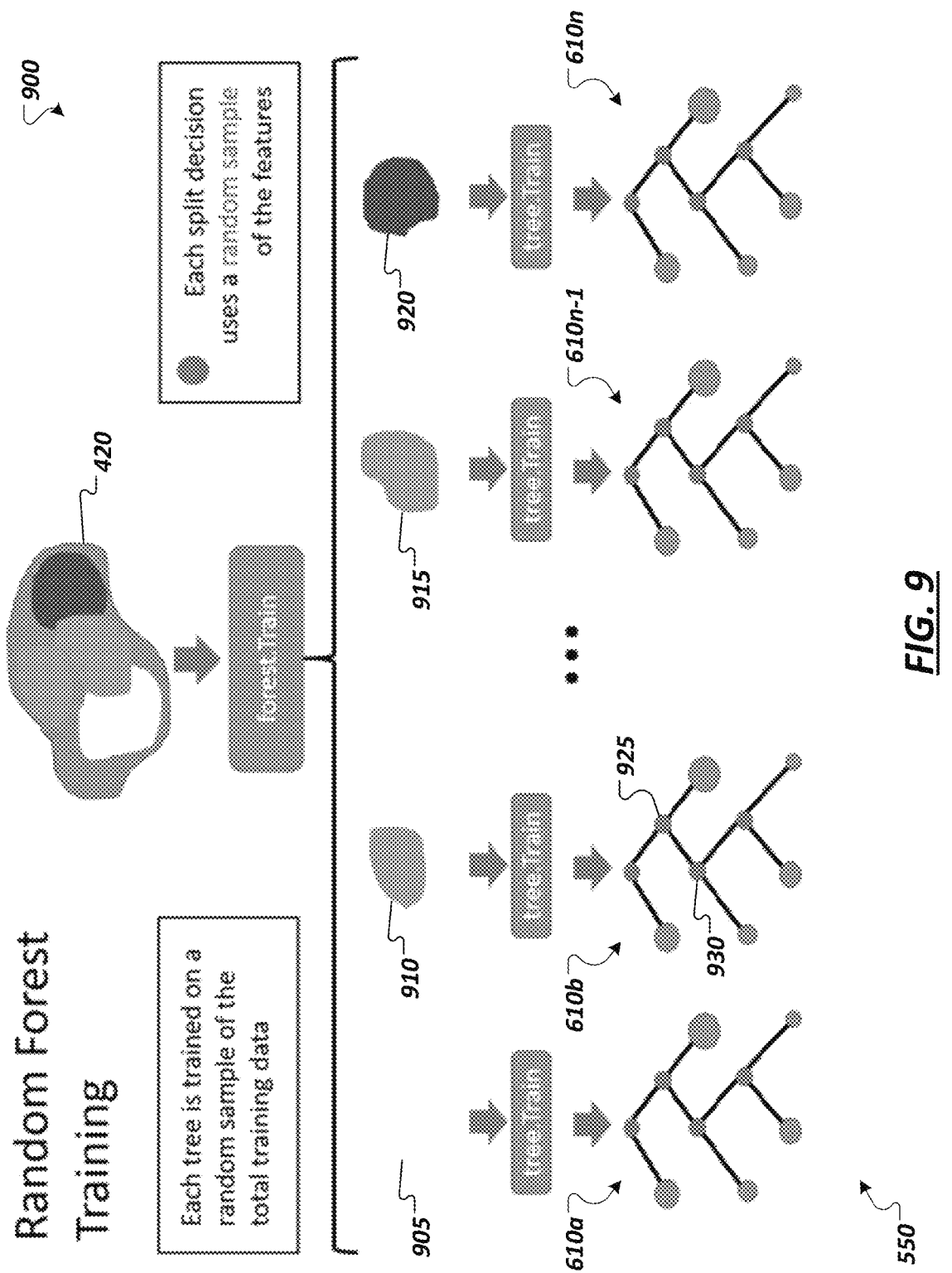
FIG. 9 is a simplified block diagram illustrating principles for training an example random forest model in accordance with some embodiments.

Turning to FIG. 9, a simplified block diagram 900 is shown illustrating an example of training a random forest using historical silicon data. In this example, a set of silicon data 420, which itself may represent only a portion of the overall silicon data available, may be selected as relevant for training a particular random forest model 550 (e.g., based on both the silicon data and the random forest relating to a particular chip manufacturing process). In this example, each constituent tree (e.g., 610*a*-610*n*) may be trained on a random sample (e.g., 905, 910, 915, 920) of the set of silicon data 420. Accordingly, different portions, or samples (e.g., 905, 910, 915, 920) may be used to train the different trees. For instance, different samples may incorporate silicon data describing testing of different historical chips and relate to different attributes of these chips. The respective test nodes (or "split decision") (e.g., 925, 930, etc.) in the constituent trees (e.g., 610*a*-610*n*) may likewise use a random sample of the overall features determined for chip layouts. For instance, various random forest training algorithms may be applied to determine the respective hyper parameters (e.g., parameters that affect the outcome the most) for the random forest model, for instance, by using cross-validation methods on the training data and measuring the correlation of these parameters on the training set. In some examples, a re-training of the hyper-parameters may be performed using the entire training set to complete the generation of the random forest model. In some implementations, a portion of historical silicon data may be utilized for training, while a remaining (e.g., smaller) portion is held back as validation data, among other examples.

Figure 10:
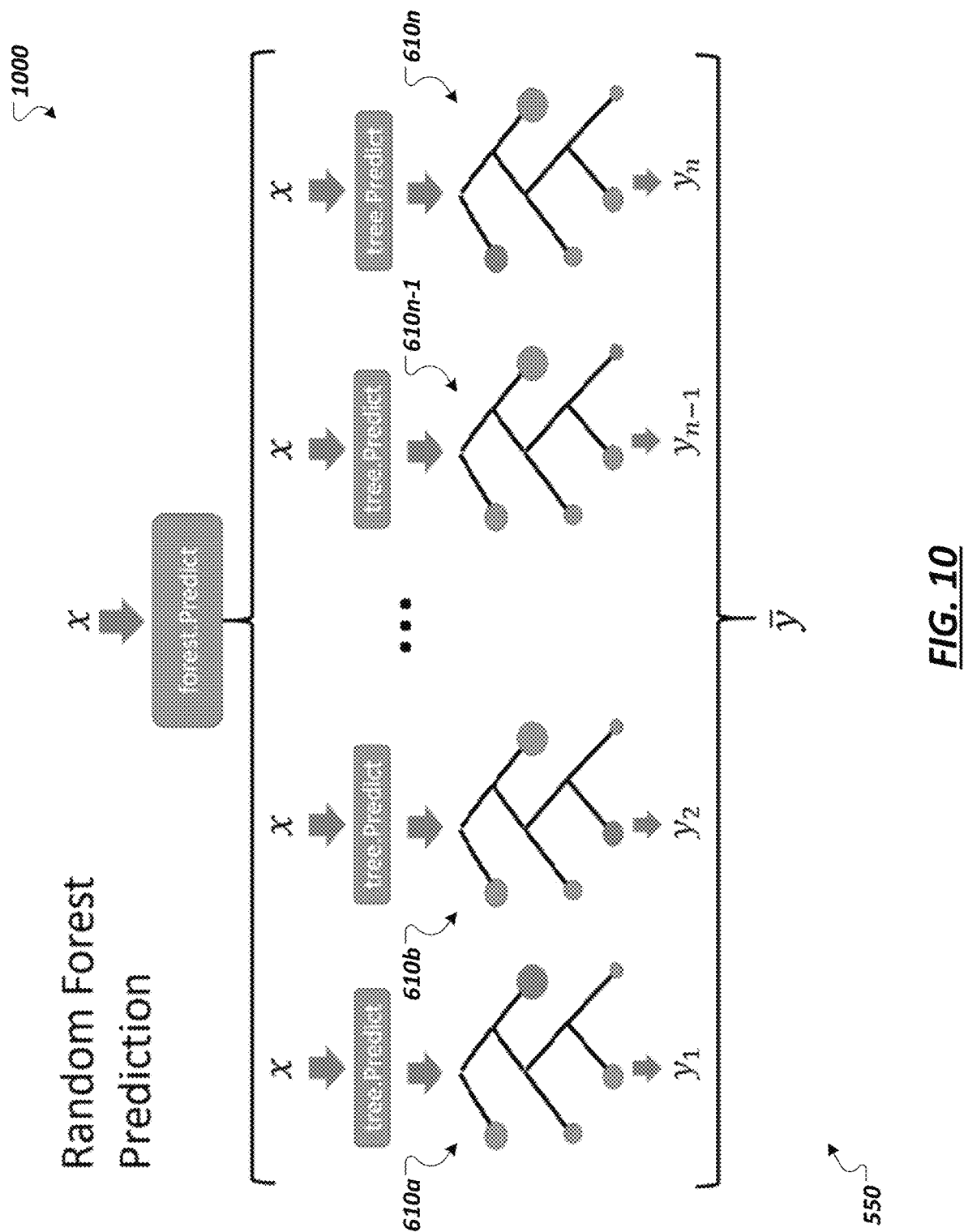
FIG. 10 is a simplified block diagram illustrating the generation of predictions using an example random forest model in accordance with some embodiments.

Turning to FIG. 10, a simplified block diagram 1000 is shown illustrating the example use of a trained version of the random forest model 550 illustrated in the example of FIG. 9. For instance, an input x may be provided to each of the constituent trees (e.g., 610*a*-610*n*), the input representing a feature vector determined for a particular chip design pattern. A predicted behavior (e.g., relating to a corresponding process step associated with the random forest model) may thereby be determined for the pattern. Indeed, in order to predict the behavior of patterns that have not yet before been seen, each individual tree (e.g., 610*a*-610*n*) in the random forest 550 may process the input features and suggests a value (e.g., $y_1$ to $y_n$) independently based on the input x. A vote aggregator block for the random forest takes the outputs of the individual trees and generates an end value for the output for the pattern based on the individual votes (e.g., based on the particular voting scheme employed at the random forest model).

Figure 11:
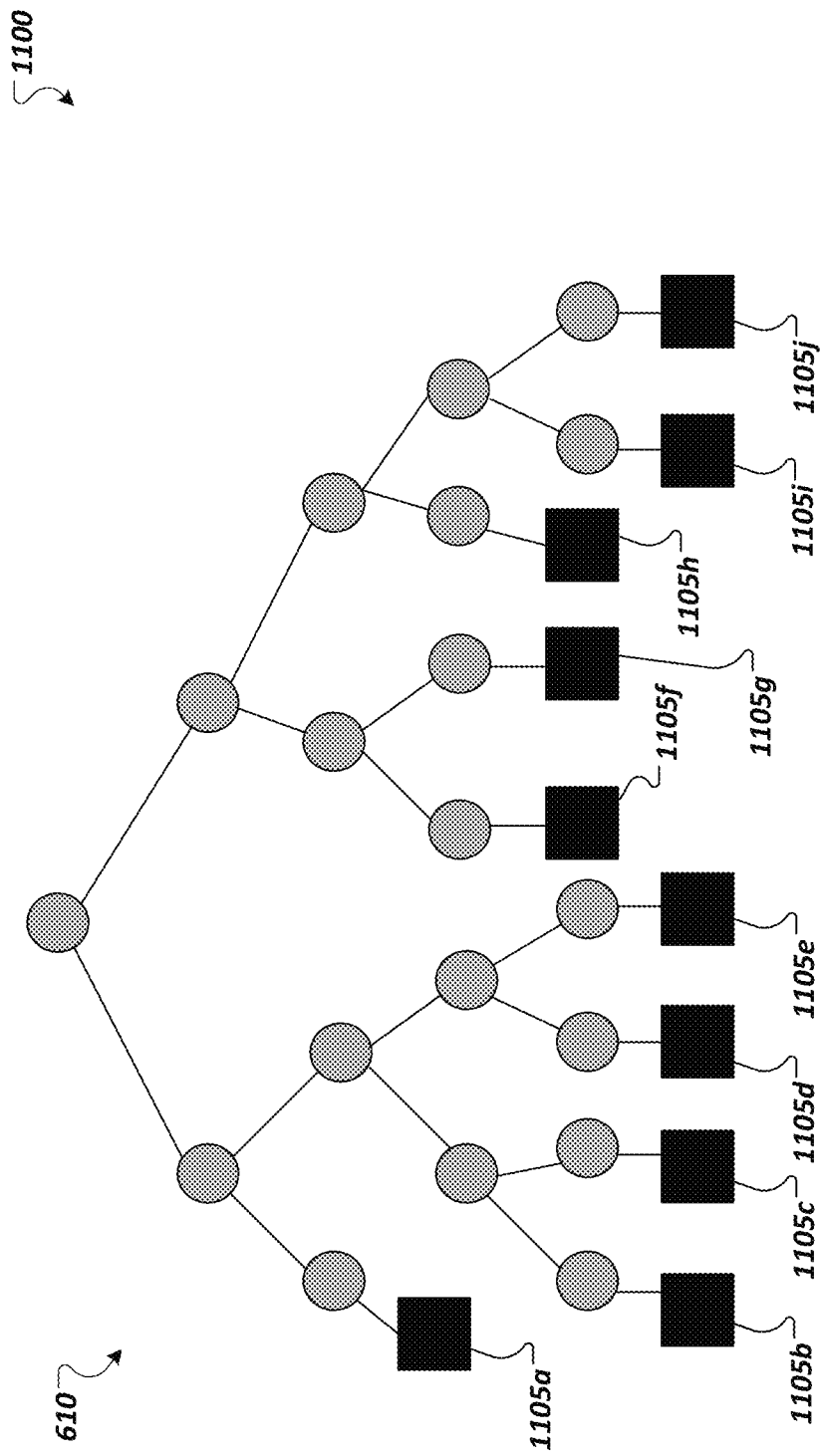
FIG. 11 is a simplified block diagram illustrating a decision tree of an example random forest model incorporating linear regression models in accordance with some embodiments.

Turning to the simplified block diagram 1100 of FIG. 11, as introduced above, the value of the attribute(s) determined by some random forest models may be discrete (even binary) values. In other cases, the random forest model may be intended to determine a continuous value. For instance, as shown in FIG. 11, if the particular application requires a smooth response curve (and no discontinuous changes between closely related input points), a respective multi-variable regression model (e.g., 1105*a-j*) may be created for each branch of each of the constituent trees (e.g., 610) of the random forest model used to determine this value. For instance, a linear regression model (e.g., 1105*a-j*) may be provided at each leaf node of each of the trees (e.g., 610), with each tree then providing the resulting value of the linear regression model as its vote to the vote aggregator block provided for the random forest model.

Figure 12:
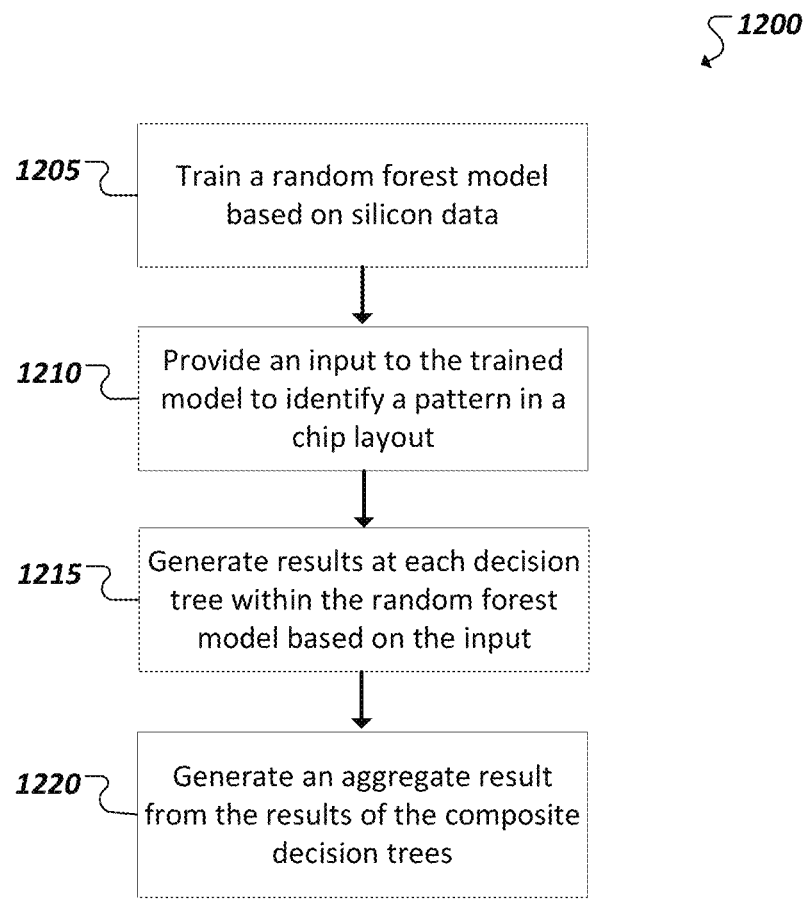
FIG. 12 is a flowchart illustrating an example technique for using random forest models to predict attributes of a proposed chip layout design in accordance with some embodiments.

FIG. 12 is a simplified flowchart 1200 showing an example technique for utilizing an example machine learning model to predict the outcome(s) of one or more chip fabrication processes were they to be applied to a proposed chip layout. For instance, the machine learning model may include a random forest model, which may be trained 1205 using training data that incorporates information from silicon data generated from testing associated with the fabrication of previous, historical chips having chip layout designs different from the proposed chip layout design. An input may be provided, or received 1210, at the trained random forest model, which describes features of a pattern within the proposed chip layout, the pattern representing a micro-level sub-area of the overall layout design. The input may be provided to each constituent tree within the random forest and each tree may generate 1215 a respective result. The results may be utilized in a voting scheme to generate 1220 an aggregated, or final, result of the random forest model for the input. The result may identify a predicted attribute relating to the potential fabrication of a chip that incorporates the proposed chip layout, among other example features.

While the foregoing discussion has focused on the application of random forest models to predict aspects of new semiconductor chip layouts, it should be appreciated that the solutions discussed above may be applied in other fields of endeavor, without diverting from the general principles discussed herein. As one example, geographic map and/or topology data describing streets, buildings, topological changes, trees, bodies of water, etc. may be utilized as training data (e.g., maps of various places throughout the world) and attributes of that geographic environment (e.g., pollution, traffic, climate, etc.) may serve to provide supervised learning of a set of random forest models. Other map data (e.g., image data, aerial LIDAR data, satellite data, etc.) describing other places (e.g., for which the attributes may not be as well studied) may be provided and relevant features extracted and fed as inputs to the set of the random forest models to yield predictive attributes for this other place. Other examples, such as the analysis of nonotechnology structures, biological structures, and other samples may also be enhanced using solutions similar to those discussed herein, among other example applications.

Figure 13:
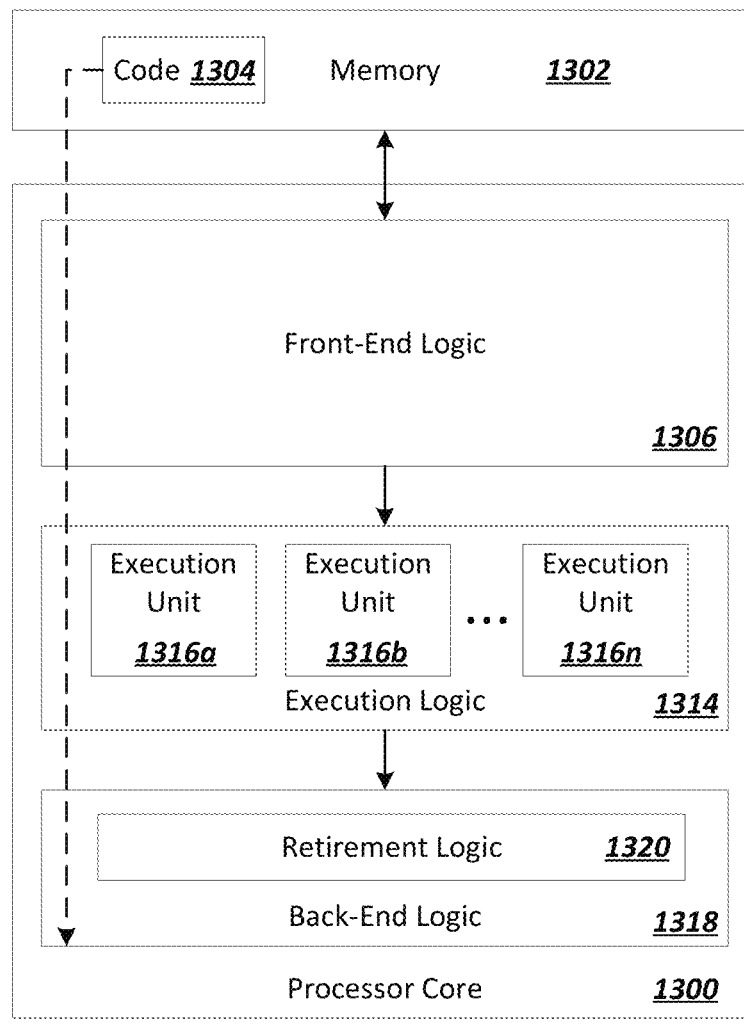
FIG. 13 is a block diagram of an exemplary processor in accordance with one embodiment.
Figure 14:
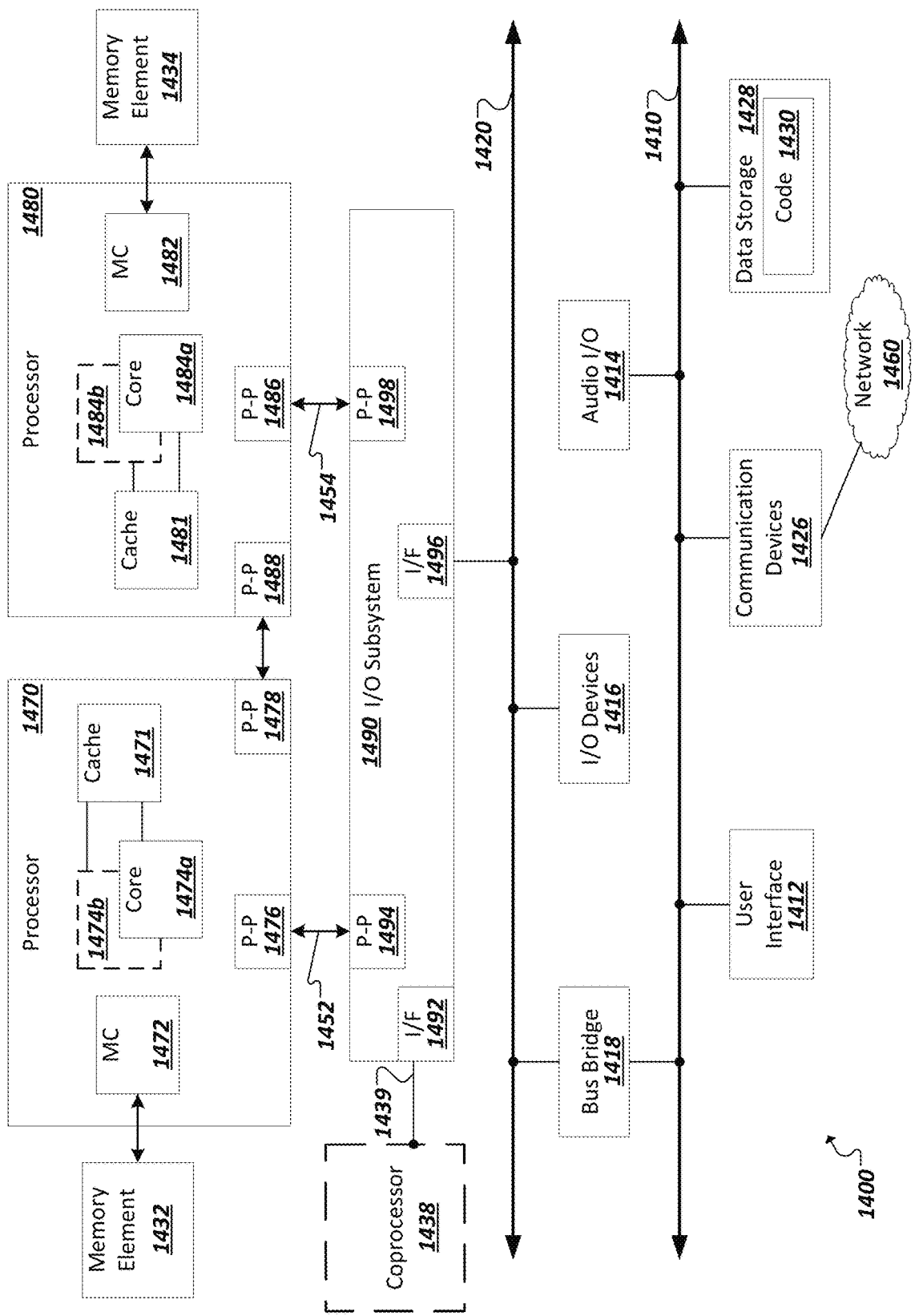
FIG. 14 is a block diagram of an exemplary computing system in accordance with one embodiment.

FIGS. 13-14 are block diagrams of exemplary computer architectures that may be used in accordance with embodiments disclosed herein. For instance, the computer architectures shown in these examples may be utilized to implement or execute an improved compiler and/or a portion of a target computing device. In other examples, the computer architectures shown in these examples may consume results generated by the neural network, provide data for use as inputs to the neural networks, among other cooperative uses. It should be appreciated that other computer architecture designs known in the art for processors and computing systems may also be used. Generally, suitable computer architectures for embodiments disclosed herein can include, but are not limited to, configurations illustrated in FIGS. 13-14.

FIG. 13 is an example illustration of a processor according to an embodiment. Processor 1300 is an example of a type of hardware device that can be used in connection with the implementations above. Processor 1300 may be any type of processor, such as a microprocessor, an embedded processor, a digital signal processor (DSP), a network processor, a multi-core processor, a single core processor, or other device to execute code. Although only one processor 1300 is illustrated in FIG. 13, a processing element may alternatively include more than one of processor 1300 illustrated in FIG. 13. Processor 1300 may be a single-threaded core or, for at least one embodiment, the processor 1300 may be multi-threaded in that it may include more than one hardware thread context (or "logical processor") per core.

FIG. 13 also illustrates a memory 1302 coupled to processor 1300 in accordance with an embodiment. Memory 1302 may be any of a wide variety of memories (including various layers of memory hierarchy) as are known or otherwise available to those of skill in the art. Such memory elements can include, but are not limited to, random access memory (RAM), read only memory (ROM), logic blocks of a field programmable gate array (FPGA), erasable programmable read only memory (EPROM), and electrically erasable programmable ROM (EEPROM).

Processor 1300 can execute any type of instructions associated with algorithms, processes, or operations detailed herein. Generally, processor 1300 can transform an element or an article (e.g., data) from one state or thing to another state or thing.

Code 1304, which may be one or more instructions to be executed by processor 1300, may be stored in memory 1302, or may be stored in software, hardware, firmware, or any suitable combination thereof, or in any other internal or external component, device, element, or object where appropriate and based on particular needs. In one example, processor 1300 can follow a program sequence of instructions indicated by code 1304. Each instruction enters a front-end logic 1306 and is processed by one or more decoders 1308. The decoder may generate, as its output, a micro operation such as a fixed width micro operation in a predefined format, or may generate other instructions, microinstructions, or control signals that reflect the original code instruction. Front-end logic 1306 also includes register renaming logic 1310 and scheduling logic 1312, which generally allocate resources and queue the operation corresponding to the instruction for execution.

Processor 1300 can also include execution logic 1314 having a set of execution units 1316*a*, 1316*b*, 1316*n*, etc. Some embodiments may include a number of execution units dedicated to specific functions or sets of functions. Other embodiments may include only one execution unit or one execution unit that can perform a particular function. Execution logic 1314 performs the operations specified by code instructions.

After completion of execution of the operations specified by the code instructions, back-end logic 1318 can retire the instructions of code 1304. In one embodiment, processor 1300 allows out of order execution but requires in order retirement of instructions. Retirement logic 1320 may take a variety of known forms (e.g., re-order buffers or the like). In this manner, processor 1300 is transformed during execution of code 1304, at least in terms of the output generated by the decoder, hardware registers and tables utilized by register renaming logic 1310, and any registers (not shown) modified by execution logic 1314.

Although not shown in FIG. 13, a processing element may include other elements on a chip with processor 1300. For example, a processing element may include memory control logic along with processor 1300. The processing element may include I/O control logic and/or may include I/O control logic integrated with memory control logic. The processing element may also include one or more caches. In some embodiments, non-volatile memory (such as flash memory or fuses) may also be included on the chip with processor 1300.

FIG. 14 illustrates a computing system 1400 that is arranged in a point-to-point (PtP) configuration according to an embodiment. In particular, FIG. 14 shows a system where processors, memory, and input/output devices are interconnected by a number of point-to-point interfaces.

Processors 1470 and 1480 may also each include integrated memory controller logic (MC) 1472 and 1482 to communicate with memory elements 1432 and 1434. Example processors (e.g., 1470, 1480) may include one or more processor cores (e.g., 1474*a-b*, 1448*a-b*), which may be coupled to respective cache memory (e.g., 1471, 1482). In alternative embodiments, memory controller logic 1472 and 1482 may be discrete logic separate from processors 1470 and 1480. Memory elements 1432 and/or 1434 may store various data to be used by processors 1470 and 1480 in achieving operations and functionality outlined herein.

Processors 1470 and 1480 may be any type of processor, such as those discussed in connection with other figures. Processors 1470 and 1480 may exchange data via a point-to-point (PtP) interface 1450 using point-to-point interface circuits 1478 and 1488, respectively. Processors 1470 and 1480 may each exchange data with a chipset 1490 via individual point-to-point interfaces 1452 and 1454 using point-to-point interface circuits 1476, 1486, 1494, and 1498. Chipset 1490 may also exchange data with a co-processor 1438, such as a high-performance graphics circuit, machine learning accelerator, or other co-processor 1438, via an interface 1439, which could be a PtP interface circuit. In alternative embodiments, any or all of the PtP links illustrated in FIG. 14 could be implemented as a multi-drop bus rather than a PtP link.

Chipset 1490 may be in communication with a bus 1420 via an interface circuit 1496. Bus 1420 may have one or more devices that communicate over it, such as a bus bridge 1418 and I/O devices 1416. Via a bus 1410, bus bridge 1418 may be in communication with other devices such as a user interface 1412 (such as a keyboard, mouse, touchscreen, or other input devices), communication devices 1426 (such as modems, network interface devices, or other types of communication devices that may communicate through a computer network 1460), audio I/O devices 1414, and/or a data storage device 1428. Data storage device 1428 may store code 1430, which may be executed by processors 1470 and/or 1480. In alternative embodiments, any portions of the bus architectures could be implemented with one or more PtP links.

The computer system depicted in FIG. 14 is a schematic illustration of an embodiment of a computing system that may be utilized to implement various embodiments discussed herein. It will be appreciated that various components of the system depicted in FIG. 14 may be combined in a system-on-a-chip (SoC) architecture or in any other suitable configuration capable of achieving the functionality and features of examples and implementations provided herein.

While some of the systems and solutions described and illustrated herein have been described as containing or being associated with a plurality of elements, not all elements explicitly illustrated or described may be utilized in each alternative implementation of the present disclosure. Additionally, one or more of the elements described herein may be located external to a system, while in other instances, certain elements may be included within or as a portion of one or more of the other described elements, as well as other elements not described in the illustrated implementation. Further, certain elements may be combined with other components, as well as used for alternative or additional purposes in addition to those purposes described herein.

Further, it should be appreciated that the examples presented above are non-limiting examples provided merely for purposes of illustrating certain principles and features and not necessarily limiting or constraining the potential embodiments of the concepts described herein. For instance, a variety of different embodiments can be realized utilizing various combinations of the features and components described herein, including combinations realized through the various implementations of components described herein. Other implementations, features, and details should be appreciated from the contents of this Specification.

Although this disclosure has been described in terms of certain implementations and generally associated methods, alterations and permutations of these implementations and methods will be apparent to those skilled in the art. For example, the actions described herein can be performed in a different order than as described and still achieve the desirable results. As one example, the processes depicted in the accompanying figures do not necessarily require the particular order shown, or sequential order, to achieve the desired results. In certain implementations, multitasking and parallel processing may be advantageous. Additionally, other user interface layouts and functionality can be supported. Other variations are within the scope of the following claims.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The following examples pertain to embodiments in accordance with this Specification. Example 1 is a machine-readable storage medium with instructions stored thereon, where the instructions are executable by a machine to cause the machine to: receive an input at a machine learning model, where the input describes a pattern within a particular chip layout, the machine learning model includes a random forest model trained using training data based on a plurality of sets of silicon data, each of the sets of silicon data describe attributes observed in association with previous fabrication of other chip layouts, and the training data further describes geometric features of the corresponding other chip layouts, where the random forest model includes a plurality of decision tree models and a voting block to implement a particular voting algorithm, and the other chip layouts are different from the particular chip layout; generate results at each of the plurality of decision tree models, where the results identify predicted attributes for the pattern associated with fabrication of the particular chip layout; and perform a vote using the voting block to determine, from the results, an output of the machine learning model, where the output identifies a predicted attribute of the pattern of the particular chip layout.

Example 2 may include the subject matter of example 1, where the machine learning model corresponds to a particular step in a chip fabrication process and the output includes a predicted attribute for the pattern corresponding to the particular step.

Example 3 may include the subject matter of example 2, where the plurality of sets of silicon data include silicon data generated from a test associated with the particular step and the silicon data describes attributes observed for the other chip layouts based on performance of the particular step on the other chip layouts.

Example 4 may include the subject matter of any one of examples 2-3, where the machine learning model includes one of a plurality of machine learning models, and the plurality of machine learning models include another random forest model trained with training data based on silicon data associated with another step in the chip fabrication process, where the other random forest model is to generate an output to identify a predicted attribute associated with the other step.

Example 5 may include the subject matter of any one of examples 1-4, where the input includes a feature set of the pattern and the feature set includes features of geometric elements present within the pattern.

Example 6 may include the subject matter of example 5, where the features of geometric elements include one or more of sizes of the geometric elements, shapes of the geometric elements, and distances between the geometric elements.

Example 7 may include the subject matter of any one of examples 5-6, where each of the plurality of decision tree models includes a respective set of test nodes and a respective set of leaf nodes, where at least a portion of each of the set of test nodes are to test whether the pattern includes a particular geometric feature.

Example 8 may include the subject matter of any one of examples 5-7, where the input includes a feature vector to specify the feature set.

Example 9 may include the subject matter of any one of examples 5-8, where the instructions are further executable to cause the machine to parse a graphical representation of the pattern to determine the feature set.

Example 10 may include the subject matter of any one of examples 1-9, where the particular chip layout is for a pre-fabrication version of a chip.

Example 11 may include the subject matter of any one of examples 1-10, where each of the plurality of decision tree models includes a respective set of test nodes and a respective set of leaf nodes and a linear regression model is attached to each of the leaf nodes, where the linear regression model is to generate a continuous value as an output of the respective decision tree model.

Example 12 may include the subject matter of any one of examples 1-11, where the predicted attribute includes an attribute to be applied during performance of a fabrication process to manufacture a chip with the particular chip layout.

Example 13 may include the subject matter of any one of examples 1-12, where the input includes a first input, the pattern includes a first pattern representing a first sub-area of the particular chip layout, and the instructions are further executable to cause the machine to: receive a second input describing a different second pattern in the particular chip layout; and generate another output from the machine learning model based on the second input.

Example 14 may include the subject matter of any one of examples 1-13, where the instructions are further executable to cause the machine to train the machine learning model with the training data, and training of the machine learning model includes supervised training based on results of testing described in the plurality of sets of silicon data.

Example 15 is a method including: receiving an input at a machine learning model, where the input describes a pattern within a particular chip layout, the machine learning model includes a random forest model trained using training data based on a plurality of sets of silicon data, each of the sets of silicon data describe processing attributes observed in association with previous fabrication processes involving other chip layouts, and the training data further describes geometric features of the corresponding to other chip layouts, where the random forest model includes a plurality of decision tree models and a voting block to implement a particular voting algorithm, and the other chip layouts are different from the particular chip layout; generating results at each of the plurality of decision tree models, where the results identify predicted processing attributes for the pattern; and performing a vote using the voting block to determine, from the results, an output of the machine learning model, where the output identifies a predicted attribute of the pattern of the particular chip layout.

Example 16 may include the subject matter of example 15, where the machine learning model corresponds to a particular step in a chip fabrication process and the output includes a predicted attribute for the pattern corresponding to the particular step.

Example 17 may include the subject matter of example 16, where the plurality of sets of silicon data include silicon data generated from a test associated with the particular step and the silicon data describes attributes observed for the other chip layouts based on performance of the particular step on the other chip layouts.

Example 18 may include the subject matter of any one of examples 16-17, where the machine learning model includes one of a plurality of machine learning models, and the plurality of machine learning models include another random forest model trained with training data based on silicon data associated with another step in the chip fabrication process, where the other random forest model is to generate an output to identify a predicted attribute associated with the other step.

Example 19 may include the subject matter of any one of examples 16-18, where the input includes a feature set of the pattern and the feature set includes features of geometric elements present within the pattern.

Example 20 may include the subject matter of example 19, where the features of geometric elements include one or more of sizes of the geometric elements, shapes of the geometric elements, and distances between the geometric elements.

Example 21 may include the subject matter of any one of examples 19-20, where each of the plurality of decision tree models includes a respective set of test nodes and a respective set of leaf nodes, where at least a portion of each of the set of test nodes are to test whether the pattern includes a particular geometric feature.

Example 22 may include the subject matter of any one of examples 19-21, where the input includes a feature vector to specify the feature set.

Example 23 may include the subject matter of any one of examples 19-22, further including parsing a graphical representation of the pattern to determine the feature set.

Example 24 may include the subject matter of any one of examples 19-23, where the particular chip layout is for a pre-fabrication version of a chip.

Example 25 may include the subject matter of any one of examples 15-24, where each of the plurality of decision tree models includes a respective set of test nodes and a respective set of leaf nodes and a linear regression model is attached to each of the leaf nodes, where the linear regression model is to generate a continuous value as an output of the respective decision tree model.

Example 26 may include the subject matter of any one of examples 15-25, where the predicted attribute includes an attribute to be applied during performance of a fabrication process to manufacture a chip with the particular chip layout.

Example 27 may include the subject matter of any one of examples 15-26, where the input includes a first input, the pattern includes a first pattern representing a first sub-area of the particular chip layout, and the method further includes: receiving a second input describing a different second pattern in the particular chip layout; and generating another output from the machine learning model based on the second input.

Example 28 may include the subject matter of any one of examples 15-27, further including training the machine learning model with the training data, and training of the machine learning model includes supervised training based on results of testing described in the plurality of sets of silicon data.

Example 29 may include the subject matter of any one of examples 15-28, further including performing additional training of the machine learning model using new silicon data to revise the random forest model.

Example 30 is a system including means to perform the method of any one of examples 15-29.

Example 31 is a system including: at least one data processor; a memory; and a machine learning engine, executable by the data processor to: access a particular machine learning model, where the particular machine learning model includes a random forest model trained based on a plurality of sets of silicon data generated from tests of previously fabricated chips; provide an input to the random forest model, where the input includes a feature set of a pattern within a particular chip layout, and the feature set identifies geometric attributes of polygonal elements within the pattern; and generate a result at the random forest model based on the input, where the result identifies a predicted attribute of the pattern based on the plurality of sets of silicon data, and the result is generated based at least in part on determining, within the random forest model, that geometric attributes of the pattern were included in the previously fabricated chips, where the previously fabricated chips have chip layouts different from the particular chip layout.

Example 32 may include the subject matter of example 31, where the memory stores a plurality of machine learning models including the particular machine learning model, and each of the plurality of machine learning models is configured to predict a different attribute for a chip layout relating to fabrication of a chip including the chip layout.

Example 33 may include the subject matter of example 32, where the different attributes include attributes relating to different steps in a chip fabrication process.

Example 34 may include the subject matter of example 32, where the plurality of machine learning models include some random forest models configured to generate discrete result values and other random forest models configured to generate continuous result values, where the other random forest models include linear regression models at each respective decision tree within the corresponding random forest model to generate the corresponding continuous result value.

Example 35 may include the subject matter of any one of examples 31-34, further including a model trainer executable by the data processor to train the random forest model using training data derived from the plurality of sets of silicon data.

Example 36 may include the subject matter of any one of examples 31-35, where the input includes a feature set of the pattern and the feature set includes features of geometric elements present within the pattern.

Example 37 may include the subject matter of example 36, where the features of geometric elements include one or more of sizes of the geometric elements, shapes of the geometric elements, and distances between the geometric elements.

Example 38 may include the subject matter of any one of examples 36-37, where each of the plurality of decision tree models includes a respective set of test nodes and a respective set of leaf nodes, where at least a portion of each of the set of test nodes are to test whether the pattern includes a particular geometric feature.

Example 39 may include the subject matter of any one of examples 36-38, where the input includes a feature vector to specify the feature set.

Example 40 may include the subject matter of any one of examples 36-39, further including parsing a graphical representation of the pattern to determine the feature set.

Example 41 may include the subject matter of any one of examples 31-40, where the particular chip layout is for a pre-fabrication version of a chip.

Example 42 is a method including: receiving an input at a machine learning model, wherein the input describes a pattern within a particular mapping, the machine learning model comprises a random forest model trained using training data based on a plurality of sets of analysis data, each of the sets of analysis data describe attributes observed in association with an analysis of other mappings, and the training data further describes geometric features of the corresponding other mappings, wherein the random forest model comprises a plurality of decision tree models and a voting block to implement a particular voting algorithm, and the other mappings are different from the particular mapping; generating results at each of the plurality of decision tree models, where the results identify predicted attributes for the pattern associated with fabrication of the particular chip layout; and performing a vote using the voting block to determine, from the results, an output of the machine learning model, where the output identifies a predicted attribute of the pattern of the particular mapping.

Example 43 includes the subject matter of example 42, wherein the particular mapping comprises a geographic map of a first area and the other mappings comprise respective geographic maps of a plurality of other areas, the plurality of sets of analysis data describe attributes of the plurality of other areas, and the predicted attribute comprises a predicted attribute of the first area.

Example 44 includes the subject matter of example 43, wherein the attributes comprise street traffic attributes.

Example 45 includes the subject matter of example 43, wherein the attributes comprise pollution attributes.

Example 46 includes the subject matter of any one of examples 43-45, wherein the pattern comprises geometry included in the geographic map.

Example 47 includes the subject matter of any one of examples 43-46, wherein the pattern is generated from one of satellite image data or aerial LIDAR data.

Example 48 is a system including means to perform the method of any one of examples 42-47.

Example 49 includes the subject matter of example 48, where the means include a machine-readable storage medium with instructions stored thereon, the instructions executable to perform at least a portion of the method of any one of examples 42-47.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. At least one machine-readable storage medium with instructions stored thereon, wherein the instructions are executable by a machine to cause the machine to:
receive an input at a machine learning model, wherein the input describes a pattern within a particular chip layout, the machine learning model comprises a random forest model trained using training data based on a plurality of sets of silicon data, each of the sets of silicon data describe attributes observed in association with previous performance of a particular one of a set of fabrication steps performed in fabrication of chips with other chip layouts, and the training data further describes geometric features of the corresponding other chip layouts, wherein the random forest model comprises a plurality of decision tree models and a voting block to implement a particular voting algorithm, and the other chip layouts are different from the particular chip layout;
generate results at each of the plurality of decision tree models, wherein the results identify predicted attributes of performance of the particular fabrication step based on the pattern of the particular chip layout; and
perform a vote using the voting block to determine, from the results, an output of the machine learning model, wherein the output identifies a predicted attribute of performance of the particular fabrication step based on the pattern of the particular chip layout.

2. The storage medium of claim 1, wherein the machine learning model corresponds to the particular fabrication step in a chip fabrication process.

3. The storage medium of claim 2, wherein the plurality of sets of silicon data comprise silicon data generated from a test associated with the particular fabrication step and the silicon data describes attributes observed for the other chip layouts based on performance of the particular fabrication step on the other chip layouts.

4. The storage medium of claim 2, wherein the machine learning model comprises one of a plurality of machine learning models, and the plurality of machine learning models comprise another random forest model trained with training data based on silicon data associated with another fabrication step in the set of fabrication steps in the chip fabrication process, wherein the other random forest model is to generate an output to identify a predicted attribute associated with the other fabrication step.

5. The storage medium of claim 1, wherein the input comprises a feature set of the pattern and the feature set comprises features of geometric elements present within the pattern.

6. The storage medium of claim 5, wherein the features of geometric elements comprise one or more of sizes of the geometric elements, shapes of the geometric elements, and distances between the geometric elements.

7. The storage medium of claim 5, wherein each of the plurality of decision tree models comprises a respective set of test nodes and a respective set of leaf nodes, wherein at least a portion of each of the set of test nodes are to test whether the pattern includes a particular geometric feature.

8. The storage medium of claim 5, wherein the input comprises a feature vector to specify the feature set.

9. The storage medium of claim 5, wherein the instructions are further executable to cause the machine to parse a graphical representation of the pattern to determine the feature set.

10. The storage medium of claim 1, wherein the particular chip layout is for a pre-fabrication version of a chip.

11. The storage medium of claim 1, wherein each of the plurality of decision tree models comprises a respective set of test nodes and a respective set of leaf nodes and a linear regression model is attached to each of the leaf nodes, wherein the linear regression model is to generate a continuous value as an output of the respective decision tree model.

12. The storage medium of claim 1, wherein the predicted attribute comprises an attribute to be applied during performance of a fabrication process to manufacture a chip with the particular chip layout.

13. The storage medium of claim 1, wherein the input comprises a first input, the pattern comprises a first pattern representing a first sub-area of the particular chip layout, and the instructions are further executable to cause the machine to:
receive a second input describing a different second pattern in the particular chip layout; and generate another output from the machine learning model based on the second input.

14. The storage medium of claim 1, wherein the instructions are further executable to cause the machine to train the machine learning model with the training data, and training of the machine learning model comprises supervised training based on results of testing described in the plurality of sets of silicon data.

15. A method comprising:
receiving an input at a machine learning model, wherein the input describes a pattern within a particular chip layout, the machine learning model comprises a random forest model trained using training data based on a plurality of sets of silicon data, each of the sets of silicon data describe processing attributes observed in association with previous performance of a particular one of a set of fabrication steps in a chip fabrication process involving other chip layouts, and the training data further describes geometric features of the corresponding to other chip layouts, wherein the random forest model comprises a plurality of decision tree models and a voting block to implement a particular voting algorithm, and the other chip layouts are different from the particular chip layout;
generating results at each of the plurality of decision tree models, wherein the results identify predicted processing attributes of performance of the particular fabrication step based on the pattern; and
performing a vote using the voting block to determine, from the results, an output of the machine learning model, wherein the output identifies a predicted attribute of performance of the particular fabrication step based on the pattern of the particular chip layout.

16. The method of claim 15, further comprising training the machine learning model using new silicon data to revise the random forest model.

17. A system comprising:
at least one data processor;
a memory; and
a machine learning engine, executable by the data processor to:
access a particular machine learning model, wherein the particular machine learning model comprises a random forest model trained based on a plurality of sets of silicon data generated from tests of previously fabricated chips, the particular machine model corresponds to a particular fabrication step in a chip fabrication process, and the plurality of sets of silicon data describe geometric features of chip layouts used in the previously fabricated chips;
provide an input to the random forest model, wherein the input comprises a feature set of a pattern within a particular chip layout, and the feature set identifies geometric attributes of polygonal elements within the pattern; and
generate a result at the random forest model based on the input, wherein the result identifies a predicted attribute of performance of the particular fabrication step based on the pattern based on the plurality of sets of silicon data, and the result is generated based at least in part on determining, within the random forest model, that geometric attributes of the pattern were included in the previously fabricated chips, wherein the previously fabricated chips have chip layouts different from the particular chip layout.

18. The system of claim 17, wherein the memory stores a plurality of machine learning models comprising the particular machine learning model, and each of the plurality of machine learning models is configured to predict a different attribute for a chip layout relating to fabrication of a chip comprising the chip layout.

19. The system of claim 18, wherein the different attributes comprise attributes relating to different steps in a chip fabrication process.

20. The system of claim 18, wherein the plurality of machine learning models comprise some random forest models configured to generate discrete result values and other random forest models configured to generate continuous result values, wherein the other random forest models comprise linear regression models at each respective decision tree within the corresponding random forest model to generate the corresponding continuous result value.

* * * * *